(12) United States Patent
Lilja

(10) Patent No.: US 9,083,341 B2
(45) Date of Patent: Jul. 14, 2015

(54) SOFT ERROR RESILIENT CIRCUIT DESIGN METHOD AND LOGIC CELLS

(71) Applicant: Robust Chip Inc., Pleasanton, CA (US)

(72) Inventor: Klas Olof Lilja, Pleasanton, CA (US)

(*) Notice: Subject to any disclaimer, the term of this patent is extended or adjusted under 35 U.S.C. 154(b) by 19 days.

(21) Appl. No.: 13/692,800

(22) Filed: Dec. 3, 2012

(65) Prior Publication Data

US 2013/0162293 A1 Jun. 27, 2013

Related U.S. Application Data

(60) Continuation-in-part of application No. 12/763,139, filed on Apr. 19, 2010, now Pat. No. 8,495,550, which is a continuation-in-part of application No. 12/354,655, filed on Jan. 15, 2009, now abandoned, (Continued)

(51) Int. Cl.
*G06F 17/50* (2006.01)
*H03K 19/003* (2006.01)
(Continued)

(52) U.S. Cl.
CPC .............. *H03K 19/215* (2013.01); *G06F 17/50* (2013.01); *G06F 17/5072* (2013.01); *H03K 19/00338* (2013.01); *H03K 19/20* (2013.01); *H03K 21/10* (2013.01)

(58) Field of Classification Search
CPC .............. H03K 19/0033; H03K 19/20; H03K 19/00392; G01R 31/31816
USPC ............. 716/50, 55, 106, 111, 119, 120, 132, 716/136, 139; 326/9, 10, 12
See application file for complete search history.

(56) References Cited

U.S. PATENT DOCUMENTS 5,065,048 A 11/1991 Asai et al.
5,111,429 A 5/1992 Whitaker
(Continued)

FOREIGN PATENT DOCUMENTS

CN 2218426 Y 1/1996
CN 1152798 6/1997
(Continued)

OTHER PUBLICATIONS

Haixia et al., "Design of a Low Power Radiation Hardened 256K SRAM", Solid-State and Integrated Circuit Technology, 2006, ICSICT, 8th International Conference, IEEE, Oct. 23, 2006, pp. 1646-1648.

(Continued)

*Primary Examiner* — Helen Rossoshek
(74) *Attorney, Agent, or Firm* — K&L Gates LLP

(57) ABSTRACT

A method is disclosed for creating a logic integrated circuit cell from an original logic integrated circuit gate. The method includes combining the original logic integrated circuit cell with a second circuit which takes as input a complement of inputs of the original logic integrated circuit cell and provides as output complements of the output of the original logic integrated circuit cell. The method further includes connecting the combined logic integrated circuit cells, where the outputs of the combined integrated circuit cells provide the inputs for other combined circuit cells such that, when the output of the original logic integrated circuit from a first combined logic integrated circuit cell is connected as input to a second combined logic integrated circuit cell, then the output of the second circuit in the first combined logic integrated circuit cell is always also connected to the second combined logic integrated circuit cell serving as the inverse of the input signals that come from the original logic integrated circuit cell.

13 Claims, 32 Drawing Sheets

IR function (NXOR with input ai, bi)

Related U.S. Application Data application No. 13/692,800, which is a continuation-in-part of application No. 13/277,135, filed on Oct. 19, 2011, now Pat. No. 8,566,770, which is a division of application No. 12/354,655, filed on Jan. 15, 2009, now abandoned.

(60) Provisional application No. 61/630,008, filed on Dec. 2, 2011, provisional application No. 61/214,071, filed on Apr. 20, 2009, provisional application No. 61/335,845, filed on Jan. 12, 2010, provisional application No. 61/336,027, filed on Jan. 15, 2010, provisional application No. 61/338,710, filed on Feb. 23, 2010, provisional application No. 61/011,599, filed on Jan. 17, 2008, provisional application No. 61/011,989, filed on Jan. 22, 2008, provisional application No. 61/068,483, filed on Mar. 7, 2008, provisional application No. 61/123,003, filed on Apr. 5, 2008.

(51) Int. Cl.
*H03K 19/21* (2006.01)
*H03K 19/20* (2006.01)
*H03K 21/10* (2006.01)

(56) References Cited

U.S. PATENT DOCUMENTS

| | | | |
|---|---|---|---|
| 5,666,288 A * | 9/1997 | Jones et al. | 716/55 |
| 5,870,332 A | 2/1999 | Lahey et al. | |
| 5,898,711 A | 4/1999 | Buer | |
| 6,127,864 A | 10/2000 | Mavis et al. | |
| 6,278,287 B1 | 8/2001 | Baze | |
| 6,326,809 B1 | 12/2001 | Gambles et al. | |
| 6,404,230 B1 * | 6/2002 | Cairns et al. | 326/68 |
| 6,433,983 B1 | 8/2002 | Fechner | |
| 6,549,443 B1 | 4/2003 | Jensen et al. | |
| 6,573,773 B2 | 6/2003 | Maki et al. | |
| 6,703,858 B2 | 3/2004 | Knowles | |
| 6,807,081 B2 | 10/2004 | Nii | |
| 6,894,334 B2 | 5/2005 | Sugiura et al. | |
| 7,023,235 B2 | 4/2006 | Hoff | |
| 7,075,337 B2 | 7/2006 | Wood et al. | |
| 7,139,190 B1 | 11/2006 | de Jong | |
| 7,215,135 B2 | 5/2007 | Carlson | |
| 7,236,001 B2 | 6/2007 | Fulkerson | |
| 7,289,375 B2 | 10/2007 | Fukui | |
| 7,298,010 B1 | 11/2007 | Ma | |
| 7,310,759 B1 | 12/2007 | Carmichael et al. | |
| 7,321,506 B2 * | 1/2008 | Roche et al. | 365/154 |
| 7,327,197 B2 | 2/2008 | Kriz | |
| 7,332,780 B2 * | 2/2008 | Matsuda et al. | 257/369 |
| 7,343,579 B2 | 3/2008 | Coxe et al. | |
| 7,489,538 B2 | 2/2009 | Maki et al. | |
| 7,504,703 B2 | 3/2009 | Yoshida | |
| 7,504,850 B2 | 3/2009 | Kuboyama et al. | |
| 7,505,300 B2 | 3/2009 | Namekawa et al. | |
| 7,515,452 B1 | 4/2009 | de Jong et al. | |
| 7,523,422 B2 | 4/2009 | Zhu et al. | |
| 7,529,118 B2 | 5/2009 | Burleson et al. | |
| 7,576,583 B2 | 8/2009 | Kuboyama et al. | |
| 7,620,883 B1 | 11/2009 | Carmichael et al. | |
| 7,627,840 B2 | 12/2009 | Kleinosowski et al. | |
| 7,644,311 B2 | 1/2010 | Lien et al. | |
| 7,679,403 B2 | 3/2010 | Erstad | |
| 7,683,675 B2 | 3/2010 | Mo | |
| 7,733,144 B2 | 6/2010 | Guo et al. | |
| 7,759,995 B2 | 7/2010 | Ishii et al. | |
| 7,761,828 B2 | 7/2010 | Miczo | |
| 7,772,874 B2 | 8/2010 | Rezgui et al. | |
| 7,773,442 B2 | 8/2010 | Kapre et al. | |
| 7,774,732 B2 | 8/2010 | KleinOsowski et al. | |
| 7,818,702 B2 | 10/2010 | Mandelman et al. | |
| 7,864,561 B2 | 1/2011 | Liaw | |
| 7,907,461 B1 | 3/2011 | Nguyen et al. | |
| 7,961,501 B1 | 6/2011 | Ryan | |
| 7,965,540 B2 | 6/2011 | Cannon et al. | |
| 8,042,071 B2 | 10/2011 | Moyer et al. | |
| 8,081,010 B1 | 12/2011 | Whitaker et al. | |
| 8,115,515 B2 | 2/2012 | Roper | |
| 8,191,021 B2 | 5/2012 | Rezgui | |
| 8,207,753 B2 | 6/2012 | Cabanas-Holmen et al. | |
| 8,278,719 B2 | 10/2012 | Morris | |
| 2004/0007743 A1 * | 1/2004 | Matsuda et al. | 257/369 |
| 2006/0255870 A1 * | 11/2006 | Roche et al. | 331/144 |
| 2007/0050740 A1 | 3/2007 | Jacobi et al. | |
| 2007/0096754 A1 | 5/2007 | Johnson et al. | |
| 2007/0242537 A1 | 10/2007 | Golke et al. | |
| 2008/0158747 A1 | 7/2008 | Voldman | |
| 2009/0044158 A1 | 2/2009 | Lilja | |
| 2009/0184733 A1 | 7/2009 | Lilja | |
| 2010/0264953 A1 | 10/2010 | Lilja | |
| 2011/0175197 A1 | 7/2011 | Furuta | |
| 2012/0180005 A1 | 7/2012 | Lilja | |
| 2012/0185816 A1 | 7/2012 | Lilja | |
| 2013/0038348 A1 | 2/2013 | Lilja | |
| 2014/0019921 A1 | 1/2014 | Lilja | |
| 2014/0157223 A1 | 6/2014 | Lilja | |
| 2014/0184320 A1 | 7/2014 | Allen et al. | |
| 2014/0184321 A1 | 7/2014 | Allen et al. | |

FOREIGN PATENT DOCUMENTS

| | | |
|---|---|---|
| CN | 1423283 A | 6/2003 |
| CN | 2629309 Y | 7/2004 |
| CN | 101114652 A | 1/2008 |
| CN | 101919162B B1 | 12/2013 |
| EP | 1387494 A1 | 2/2004 |
| EP | 1720257 A1 | 11/2006 |
| EP | 1760888 A2 | 3/2007 |
| EP | 2280346 A1 | 2/2011 |
| EP | 2245740B1 B1 | 3/2014 |
| JP | 2002-373899 A | 12/2002 |
| JP | 2005-101495 A | 4/2005 |
| JP | 2006-339355 A | 12/2006 |
| WO | WO2010123940 A2 | 10/2010 |
| WO | WO2013082611 A2 | 6/2013 |
| WO | WO2014/066402 A1 | 5/2014 |

OTHER PUBLICATIONS

Calin et al., "Upset Hardened Memory Design for Submicron CMOS Technology", IEEE Transactions on Nuclear Science, vol. 43, No. 6, Dec. 1, 1996, pp. 2874-2878.

Amusan et al., "Directional Sensitivity of Single Event Upsets in 90 nm CMOS Due to Charge Sharing", Dec. 2007, IEEE Transactions on Nuclear Science, vol. 54, No. 6, Part 1, pp. 2584-2589.

Amusan et al. "Mitigation techniques for single event induced charge sharing in a 90 nm bulk CMOS process", Published 2011, 46th Annual International Reliability Physics Symposium, IRPS 2008, IEEE, pp. 468-472.

Amusan et al., "Single Event Upsets in a 130 nm Hardened Latch Design Due to Charge Sharing", 2007, 45th Annual International Reliability Physics Symposium, IEEE, pp. 306-311.

Lee et al., "Design Framework for Soft-Error-Resilient Sequential Cells", Dec. 2011, IEEE Transactions on Nuclear Science, vol. 58, No. 6, Part 1, pp. 3026-3032.

Lee et al., "LEAP: Layout Design through Error-Aware Transistor Positioning for soft-error resilient sequential cell design", 2010, International Reliability Physics Symposium, IRPS, IEEE, pp. 203-212.

Wang et al. "Low-Overhead SEU-Tolerant Latches", 2007, International Conference on Microwave and Millimeter Wave Technology, ICMMT, pp. 1-4.

Naseer et al., "DF-DICA: A Scalable Solution for Soft Error Tolerant Circuit Design", 2006, IEEE International Symposium on Circuits and Systems, ISCAS, pp. 3890-3893.

Casey et al., "Single-Event Tolerant Latch Using Cascode-Voltage Switch Logic Gates", Dec. 2006, IEEE Transactions on Nuclear Science, vol. 53, No. 6, pp. 3386-3391.

(56) References Cited

OTHER PUBLICATIONS

Blum et al., "Multiple Node Upset Mitigation in TPDICE-Based Pipeline Memory Structures", 2008, 51st Midwest Symposium on Circuits and Systems, MWSCAS, pp. 314-317.
Amusan et al., "Single Event Upsets in Deep-Submicrometer Technologies Due to Charge Sharing", Sep. 2008, IEEE Transactions on Device and Materials Reliability, vol. 8, No. 3, pp. 582-589.
Cannon et al., "Multi-bit Upsets in 65 nm SOI SRAMs", 2008, IEEE 46th Annual International Reliability Physics Symposium, Phoenix, pp. 195-201.
Narasimham et al., "Effects of Guard Bands and Well Contacts in Mitigating Long SETs in Advanced CMOS Processes", Jun. 2008, IEEE Transactions on Nuclear Science, vol. 55, No. 3, pp. 1708-1713.
Naseer et al., "The DF-DICE Storage Element for Immunity to Soft Errors", 2005, IEEE, University of Southern California, pp. 303-306.
Seifert et al., "Multi-Cell Upset Probabilities of 45nm High-k + Metal Gate SRAM Devices in Terrestrial and Space Environments", 2008, IEEE, 46th Annual International Reliability Physics Symposium, Phoenix, pp. 181-186.
Kim, Yong Tae and Sun Il Shim, "Electrical analysis of Metal-Ferroelectric-Semiconductor Field-Effect Transistor with SPICE combined with Technology Computer-Aided Design", Journal of the Microelectronics & Packaging Society, 2005, vol. 12, No. 1, pp. 59-63. (English abstract).
Lee, Hoong-Joo and Jun-Ha Lee, "Computer Modeling of Impurity Diffusion in Poly-silicon for Display Devices", Journal of the Korea Academia-Industrial Cooperation Society, 2004, vol. 5, No. 3, pp. 210-217. (English abstract).
Benedetto et al., "Heavy Ion-Induced Digital Single-Event Transients in Deep Submicron Processes", IEEE Transactions on Nuclear Science, vol. 51, No. 6, Dec. 2004, pp. 3480-3485.
Mitra et al., "Combinational Logic Soft Error Correction", International Test Conference, 2006, ITC, IEEE International, pp. 1-9.
Gadlage et al., "Modeling and verification of single event transients in deep submicron technologies", 2004, IEEE 42nd Annual International Reliability Physics Symposium Proceedings, pp. 673-674.
Nicolaidis, M. "Design for soft error mitigation", IEEE Transactions on Device and Materials Reliability, Sep. 2005, vol. 5, Issue 3, pp. 405-418.
ACCURO™ User's Manual, Robust Chip, 2007, 133 pages.
Baumann, Robert C., "The Impact of Technology Scaling on Soft Error Rate Performance and Limits to the Efficacy of Error Correction", IEDM, 2002, pp. 329-332.
Baumann, Robert C., "Radiation-Induced Soft Errors in Advanced Semiconductor Technologies", IEEE Transactions on Device and Materials Reliability, Sep. 2005, vol. 5, No. 3, pp. 305-316.
Lilja, Klas, "Simulation Techniques for SEEs and Single Event Multiple Upset (SEMU) in ≤ 90 nm Technologies", Robust Chip Inc., 2007, Single Event Effects Symposium, pp. 1-4.
Nguyen et al., "Chip-Level Soft Error Estimation Method", IEEE Transactions on Device and Materials Reliability, Sep. 2005, vol. 5, No. 3, 365-381.
Seifert et al., "Radiation-Induced Soft Error Rates of Advanced CMOS Bulk Devices", 2006, 44th Annual International Reliability Physics Symposium, San Jose, pp. 217-225.
Office Action mailed Jan. 27, 2012 in U.S. Appl. No. 12/763,139.
Office Action mailed Apr. 3, 2012 in U.S. Appl. No. 12/763,139.
Office Action mailed Aug. 17, 2012 in U.S. Appl. No. 12/763,139.
Notice of Allowance mailed Mar. 29, 2013 in U.S. Appl. No. 12/763,139.
Applicant-Initiated Interview Summary mailed Mar. 29, 2013 in U.S. Appl. No. 12/763,139.
Office Action mailed Dec. 1, 2010 in U.S. Appl. No. 12/101,808.
Notice of Non-Compliant Amendment mailed May 6, 2011 in U.S. Appl. No. 12/101,808.
Office Action mailed Jun. 21, 2011 in U.S. Appl. No. 12/101,808.
Notice of Abandonment mailed Feb. 1, 2012 in U.S. Appl. No. 12/101,808.
First Action Interview Pilot Program Pre-Interview Communication mailed Jan. 22, 2013 in U.S. Appl. No. 13/277,135.
Applicant-Initiated Interview Summary mailed Apr. 4, 2013 in U.S. Appl. No. 13/277,135.
First Action Interview Office Action Summary mailed Apr. 4, 2013 in U.S. Appl. No. 13/277,135.
Office Action mailed Feb. 25, 2011 in U.S. Appl. No. 12/354,655.
Office Action mailed Apr. 21, 2011 in U.S. Appl. No. 12/354,655.
Notice of Non-Compliant Amendment mailed Sep. 7, 2011 in U.S. Appl. No. 12/354,655.
Office Action mailed Nov. 3, 2011 in U.S. Appl. No. 12/354,655.
Examiner-Initiated Interview Summary and Notice of Abandonment mailed Jun. 11, 2012 in U.S. Appl. No. 12/354,655.
Notice of Allowance mailed Feb. 22, 2013 in U.S. Appl. No. 13/425,231.
U.S. Appl. No. 13/463,704, filed May 3, 2012.
U.S. Appl. No. 13/463,706, filed May 3, 2012.
D'Alessio et al., "Design of a Nanometric CMOS Memory Cell for Hardening to a Single Event with a Multiple Node Upset", 2012, IEEE Transactions on Device and Materials Reliability, pp. 1-6.
Notice of Allowance mailed Jun. 20, 2013 in U.S. Appl. No. 13/277,135.
Office Action mailed Jun. 12, 2013 in U.S. Appl. No. 13/463,704.
Office Action mailed Jun. 17, 2013 in U.S. Appl. No. 13/463,706.
Office Action mailed Jun. 4, 2013 in U.S. Appl. No. 13/463,688.
Office Action mailed Nov. 1, 2013 in U.S. Appl. No. 14/026,648.
International Search Report and Written Opinion of the International Searching Authority for PCT/US2012/067628 dated Oct. 31, 2013.
Partial European Search Report for EP 13176436.7 dated Dec. 13, 2013.
Notice of Abandonment mailed Jan. 30, 2014 in U.S. Appl. No. 13/463,704.
Notice of Abandonment mailed Feb. 5, 2014 in U.S. Appl. No. 13/463,706.
Office Action mailed Apr. 1, 2014 in U.S. Appl. No. 14/026,648.
U.S. Appl. No. 14/060,162, filed Oct. 22, 2013.
Notice of Abandonment mailed Jan. 16, 2013 in U.S. Appl. No. 13/463,688.
Office Action mailed Aug. 8, 2014 in U.S. Application No. 14/026,648.
Advisory Action mailed Oct. 20, 2014 in U.S. Application No. 14/026,648.
Notice of Allowance mailed Dec. 8, 2014 in U.S. Application No. 14/026,648.
Notice of Allowance mailed Jun. 22, 2015 in U.S. Application No. 14/026,648.
Office Action mailed May 29, 2014 in U.S. Appl. No. 14/060,162.
Office Action mailed Sep. 22, 2014 in U.S. Appl. No. 14/060,162.

* cited by examiner

IR function (NXOR with input ai, bi)

| INPUT | | | | OUTPUT | IR |
|---|---|---|---|---|---|
| | LEAP^R XOR | | | | |
| | | | | XOR | XNOR |
| a | b | ai=!a | bi=!b | Q=a⊕b | Qi=!(ai⊕bi) |
| 0 | 0 | 1 | 1 | 0 | 1 |
| 0 | 1 | 1 | 0 | 1 | 0 |
| 1 | 0 | 0 | 1 | 1 | 0 |
| 1 | 1 | 0 | 0 | 0 | 1 |
| INPUT ERROR ANALYSIS: | | | | | |
| 0 | 0 | 0 | 1 | 1 | 1 |
| 0 | 0 | 1 | 0 | 1 | 1 |
| 0 | 1 | 0 | 0 | 1 | 1 |
| 0 | 1 | 1 | 1 | 0 | 0 |
| 1 | 0 | 1 | 1 | 0 | 0 |
| 1 | 0 | 0 | 0 | 1 | 1 |
| 1 | 1 | 1 | 0 | 0 | 0 |
| 1 | 1 | 0 | 1 | 0 | 0 |
| 1 | 0 | 1 | 1 | 0 | 0 |
| 0 | 1 | 1 | 1 | 0 | 0 |
| 1 | 1 | 1 | 0 | 0 | 0 |
| 0 | 0 | 1 | 0 | 1 | 1 |
| 0 | 0 | 0 | 1 | 1 | 1 |
| 1 | 1 | 0 | 1 | 0 | 0 |
| 0 | 1 | 0 | 0 | 1 | 1 |
| 1 | 0 | 0 | 0 | 1 | 1 |

FIG. 4

SOFT ERROR RESILIENT CIRCUIT DESIGN METHOD AND LOGIC CELLS

CROSS-REFERENCE TO RELATED APPLICATIONS

This application is a continuation-in-part of U.S. application Ser. No. 12/763,139 filed on Apr. 19, 2010, and entitled "SOFT ERROR HARD ELECTRONIC CIRCUIT AND LAYOUT," which is incorporated herein by reference in its entirety, a continuation-in-part of U.S. application Ser. No. 13/277,135, filed on Oct. 19, 2011 and entitled "LAYOUT METHOD FOR SOFT-ERROR HARD ELECTRONICS, AND RADIATION HARDENED LOGIC CELL" and further claims the benefit of U.S. Provisional Patent Application No. 61/630,008 filed on Dec. 2, 2011, entitled "SOFT ERROR HARD ELECTRONICS LAYOUT ARRANGEMENT AND LOGIC CELLS," which is incorporated herein by reference in its entirety; U.S. application Ser. No. 12/763, 139 is a continuation-in-part of U.S. application Ser. No. 12/354,655 filed on Jan. 15, 2009, entitled "LAYOUT METHOD FOR SOFT-ERROR HARD ELECTRONICS, AND RADIATION HARDENED LOGIC CELL," which is incorporated herein by reference in its entirety, and further claims the benefit of U.S. Provisional Patent Application No. 61/214,071 filed on Apr. 20, 2009, U.S. Provisional Patent Application No. 61/335,845 filed Jan. 12, 2010, U.S. Provisional Patent Application No. 61/336,027 filed on Jan. 15, 2010, and U.S. Provisional Patent Application No. 61/338, 710 filed on Feb. 23, 2010; U.S. application Ser. No. 13/277, 135 is a divisional of U.S. application Ser. No. 12/354,655, which further claims the benefit of U.S. Provisional Patent Application No. 61/011,599 filed on Jan. 17, 2008, U.S. Provisional Patent Application No. 61/011,989 filed on Jan. 22, 2008, U.S. Provisional Patent Application No. 61/068,483 filed on Mar. 7, 2008, and U.S. Provisional Patent Application No. 61/123,003 filed on Apr. 5, 2008.

STATEMENT REGARDING FEDERALLY SPONSORED RESEARCH OR DEVELOPMENT

This invention was made with Government support under contract HDTRA1-11-P-0018 awarded by DTRA. The Government has certain rights in this invention.

BACKGROUND

In one instance, the present invention is related generally to circuits and circuit layouts for logic circuits in which the logic circuit is protected against soft errors (non-destructive errors) and/or in which the effects of soft-errors are greatly reduced. The circuits and methods discussed herein may be particularly useful for complementary metal-oxide-semiconductor (CMOS) based logic circuits in modern technologies (≤90 nm). Unique circuit configurations as disclosed herein may protect the circuits against single event generated soft-errors.

Soft errors generated by single event transients (and single event upsets) are expected to increase drastically in ultra-deep submicron (<90 nm) technologies. Of particular significance is that logic circuits are expected to become much more sensitive to radiation generated soft-errors and possibly surpass memory as the major source of single event errors. Furthermore, the generation rate of multiple errors, multiple bit upsets (MBU), single-event multiple upset (SEMU) increases.

One reason for this increase is that, with a higher feature integration and higher frequencies, the spatial distribution and pulse length of a single event transient (SET) becomes become relatively larger, increasing the probability that an SET pulse is latched-in as a (soft-) error, or that SET pulses are generated simultaneously on several circuit nodes by one single event.

Increasing soft-error rates is further complicated by the escalating cost of semiconductor design and manufacturing. The high cost involved in developing and maintaining a semiconductor fabrication plant (FAB) makes it highly desirable to use standard commercial semiconductor manufacturing also for application that require a high radiation tolerance. Hence, there is a need to develop efficient and robust radhard-by-design (RHBD) techniques for these applications.

Furthermore, the design process is also becoming very complex and expensive, and it would be desirable to be able to re-use standard design intellectual property (IP) and libraries as much as possible for radhard applications.

Current radhard-by-design technology for single event errors include triplication (triple mode redundancy (TMR)), or duplication (built-in soft-error resilience (BiSER)) of circuits, combined some form of voting circuitry. These techniques generate undesirable power and area overhead, and current versions of these techniques cannot handle MBUs or SEMUs. Error correction codes (ECC) for memory, which also (loosely) could be classified as RHBD, is more efficient than duplication/triplication and can, with additional overhead, handle multiple errors in memory circuitry. However, the application of a corresponding error correction to logic circuits is very limited and application specific (e.g., selective parity check or insertion of specialized checking circuit IP).

State-of-the art for layout techniques for soft-error hard design mainly consist of simple spacing and sizing, and in adding additional contacts.

The inverse, or complement, of an output, or input, is the opposite value of the voltage of the circuit node with respect to the application. In a binary logic circuit each output or input is either high or low, represented by two different voltage values, which are the inverse of each other. Similarly for other application the inverse of a signal is defined by the states (or conditions) the circuit can be in.

SUMMARY

In various embodiments, provided are computer-implemented systems useful in designing and/or making logic circuit cells, methods of making logic circuit cells and circuit layouts, and logic circuit cells and components as well as associated layouts. Also provided are two explicit combinational logic cells, an XOR/NXOR and an OR/NOR gate, created using this method, and their physical layout arrangement, are examples of logic cells.

FIGURES

The novel features of the embodiments described herein are set forth with particularity in the appended claims. The embodiments, however, both as to organization and methods of operation may be better understood by reference to the following description, taken in conjunction with the accompanying drawings as follows.

FIG. 4 is an error analysis for an XOR CDIR circuit using a procedure in accordance with one embodiment.

DESCRIPTION

Figures 1, 2:
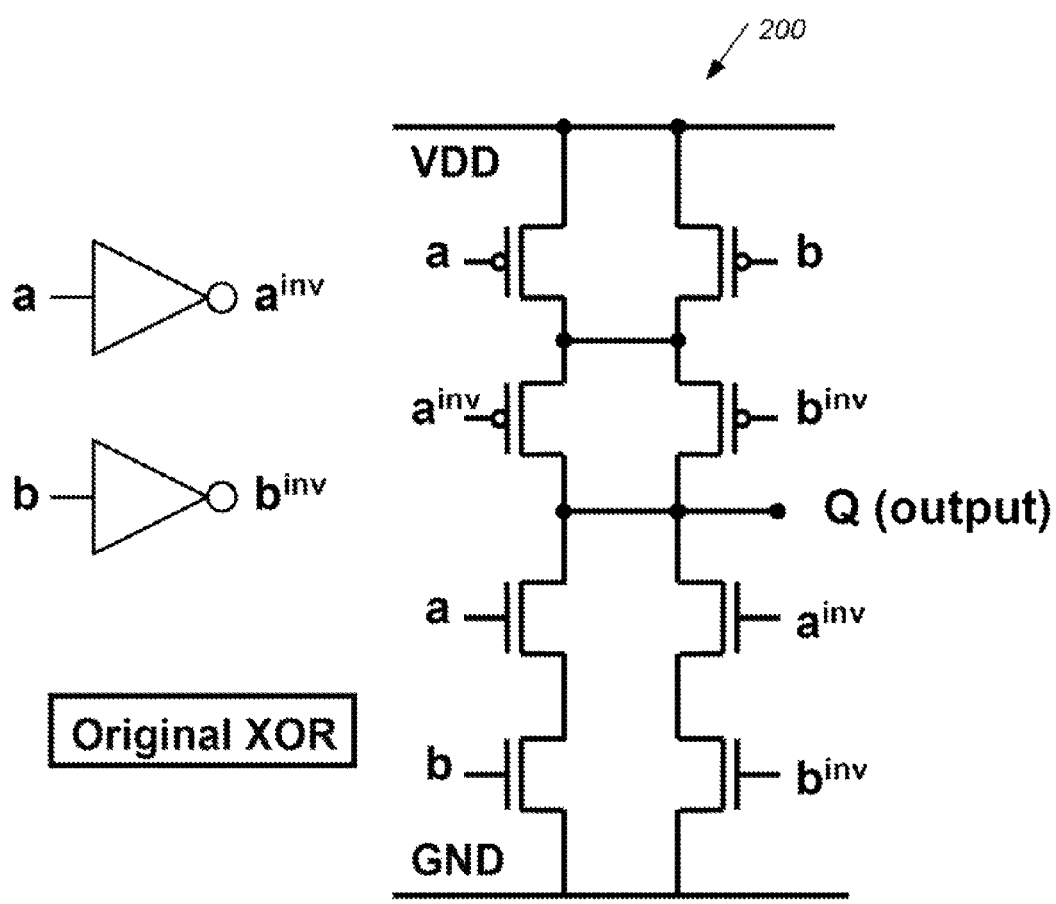
FIG. 1 illustrates a truth table for a basic XOR gate and for an inverse-redundant (IR) gate.
FIG. 2 illustrates one embodiment of an implementation of an original XOR cell using CMOS logic.

Before explaining the various embodiments of the soft error hard electronics layout arrangement and logic cells in detail, it should be noted that the various embodiments disclosed herein are not limited in their application or use to the details of construction and arrangement of parts illustrated in the accompanying drawings and description. Rather, the disclosed embodiments are may be positioned or incorporated in other embodiments, variations and modifications thereof, and may be practiced or carried out in various ways. Accordingly, embodiments of the soft error hard electronics layout arrangement and logic cells disclosed herein are illustrative in nature and are not meant to limit the scope or application thereof. Furthermore, unless otherwise indicated, the terms and expressions employed herein have been chosen for the purpose of describing the embodiments for the convenience of the reader and are not to limit the scope thereof. In addition, it should be understood that any one or more of the disclosed embodiments, expressions of embodiments, and/or examples thereof, can be combined with any one or more of the other disclosed embodiments, expressions of embodiments, and/or examples thereof, without limitation.

In the following description, like reference characters designate like or corresponding parts throughout the several views. Also, in the following description, it is to be understood that terms such as front, back, inside, outside, top, bottom and the like are words of convenience and are not to be construed as limiting terms. Terminology used herein is not meant to be limiting insofar as devices described herein, or portions thereof, may be attached or utilized in other orientations. The various embodiments will be described in more detail with reference to the drawings.

Accordingly, in one embodiment, the present invention provides a procedure to automatically simplify the logic integrated circuit which has been (automatically) generated by, starting from any initial logic circuit, combining the initial circuit with a second logic circuit, and then simplifying the combined circuit to generate a new combined circuit. The automated procedure is performed by a computer which takes the original circuit as input, generates the second circuit, performs the analysis steps in the procedure, and generates the new combined circuit.

In one embodiment, the procedure disclosed herein for creating a new generated circuit is done in such a way that an efficient layout can be (automatically) created for the circuit using. By way of example, the procedure disclosed herein may employ the method of making an integrated circuit disclosed in commonly owned U.S. patent application Ser. Nos. 12/354,655 and 12/763,139, each of which is incorporated by reference herein as if put forth in full below. Since a layout fully specifies an integrated circuit, and can be transformed to the integrated circuit itself (by sending the layout to a manufacturing facility, e.g., a semiconductor foundry), a final integrated circuit may be created by the present method.

In one embodiment, the method takes as input a specification (netlist) for a logic circuit with inputs and outputs. The method then generates a new, second, circuit cell, and its layout, whereby the second circuit is such that it takes as input both the input of an original cell and the inverse of the input of the original cell, and generates as output both the output of the original cell, and the inverse of the output of the original cell (for each combination of inputs of the original cell). The new second cell is here denoted as an inverse-redundant (IR) circuit, and the resulting circuit, which combines the original cell and the IR cell, the combined-dual-inverse-redundant (CDIR) cell. As mentioned above, the CDIR cell is such that it can very effectively be laid out using the layout methodology disclosed in U.S. patent application Ser. No. 12/354,655. The logic that uses CDIR cells, and carries both the original data signal and the inverse of the data signal, is denoted the CDIR logic.

The inverse, or complement, of an output, or input, is the opposite value of the voltage of the circuit node with respect to the application. In a binary logic circuit each output or input is either high or low, represented by two different voltage values, which are the inverse of each other. Similarly for other application the inverse of a signal is defined by the states (or conditions) the circuit can be in.

In accordance with the disclosed embodiments, method is provided to automatically simplify the new, second, IR circuit cell. The method also comprises an exclusive OR gate (XOR), and its complement XNOR, and a transmission-gate based OR, and its complement AND cell, which have been generated using this method, and laid out using the method disclosed in U.S. patent application Ser. No. 12/354,655.

As described in U.S. patent application Ser. No. 12/763, 139, when the CDIR cells are laid out using the layout methodology disclosed in U.S. patent application Ser. No. 12/354, 655, an error cannot occur on both the data signals. Therefore, any error pulses can be filtered out by inserting filters that filter the signal if the data signal and the dual inverse of the data signal are the same (and not the inverse of each other). Such filtering can be achieved by the special latch and special flip-flop disclosed in U.S. patent application Ser. No. 12/763, 139, or by any other type of filter.

In one embodiment, the method to simplify the CDIR cell benefits from the fact that both the original signal and its inverse are readily available in the logic, and therefore, if the original circuit cell uses the inverse of the original data somewhere in its implementation, this inverse data does not have to be generated by the cell itself, but instead the readily available input from the logic, of the inverse of the original signal is used. Conversely, if the new second IR cell uses the original data somewhere in its implementation, this signal does not have to be generated by the cell itself (by inverting the input of the IR cell back to the original data), instead it can use the readily available original input data.

However, since the error correctness will not be maintained if an error is generated on both of the signals of the logic (it cannot be filtered), i.e., both on the output of the original cell and on the output of the new second cell, it must first be ensured that one single error on any of the original inputs or the inverse inputs, cannot generate an error on both of the outputs. A logic cell, can be implemented in many different ways, and many standard implementation, and methods to implement a specific logic functions in different ways using different semiconductor devices are available in the literature and in the engineering and scientific community. Therefore, a CDIR cell, that can be simplified as described herein, may be possible for some implementations of the original and the CDIR cell function, but not for others. However, the number of different methods fro implementing a circuit function with a certain set of electronic devices, for example n-type MOSFETs and p-type MOSFETs is finite, and since the circuit should use as few devices as possible it is actually quite small, and all possible implementation can be explored.

In one embodiment, a procedure and criterion for the simplification of the CDIR implementation of a certain circuit is:

PROCEDURE: For an implementation of the original circuit and for its CDIR complement, for each combination of the inputs, find the output of the original gate and of the CDIR gate, when an error occurs on one, and only one, input of the original or the CDIR gate.

CRITERION: If there is no such input errors, for none of the input combinations, generate an error on both the output of the original circuit cell and on the IR cell, then the simplification can be made, i.e., the dual inverse signal from the logic (feeding the circuit) can be used as the inverse of the original inputs to the original gate, and the original signal from the logic can be used as the inverse of the inputs to the IR gate. All circuitry that is not needed (in either cell), after this replacement of input signals, can be removed.

A computer, when executing executable instructions according to the computer-implemented method, applies all possible input combinations to the CDIR circuit, calculates the value of all the outputs, and evaluates the criterion. When the criterion is fulfilled, the computer-implemented method removes all parts of the circuit associated with inverting an input signal, and generates the new circuit. As discussed herein, using the computer-implemented method of making the layout, and thereby the final integrated circuit, the final integrated circuit is generated by the computer-implemented method.

Applying the procedure to an implementation of an exclusive OR function, XOR, provides a novel CDIR XOR gate. This XOR gate, which also implements an XNOR function, has been laid out using the methodology disclosed in U.S. patent application Ser. No. 12/354,655. The IR cell for the original XOR cell is an NXOR gate operating on the inverse of the two original inputs. A truth table 100 of both the original XOR and the corresponding IR cell are shown in FIG. 1.

Figure 3:
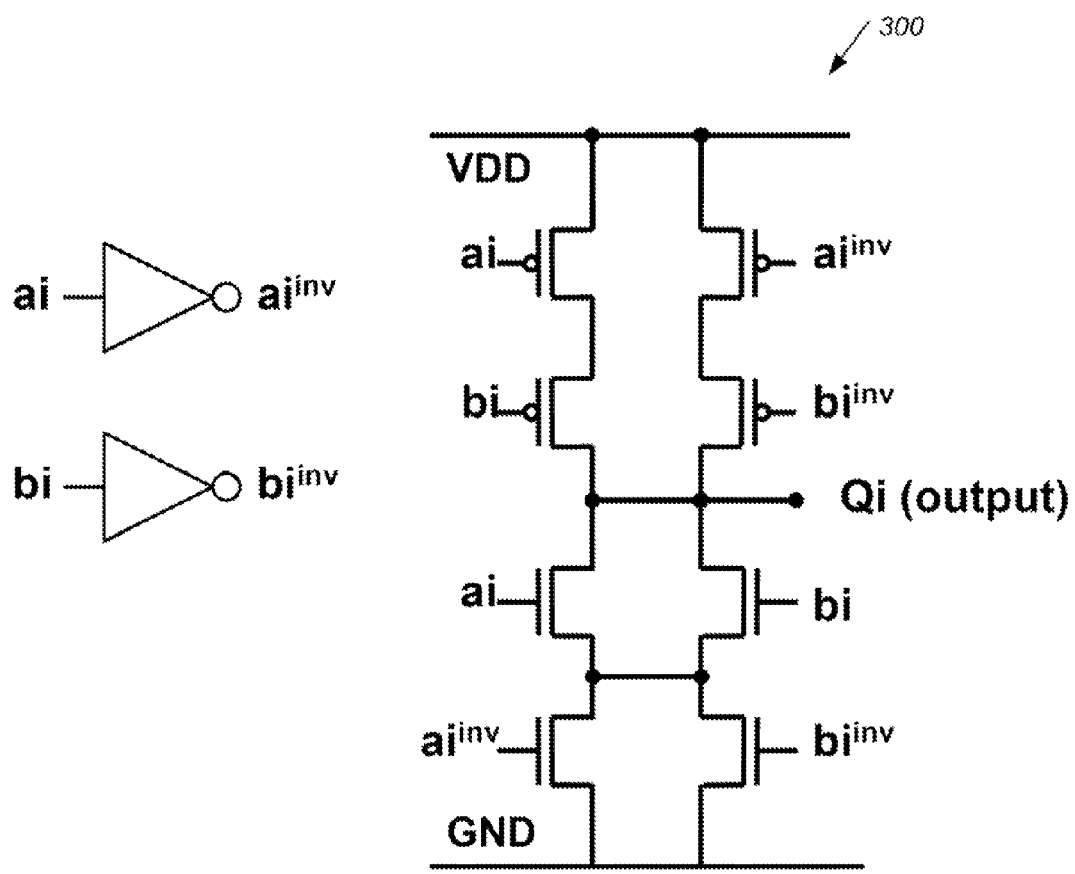
FIG. 3 illustrates one embodiment of an implementation of an inverse-redundant (IR) XNOR cell operating on the inverse data signals in a combined-dual-inverse-redundant (CDIR) logic (ai, bi) cell using CMOS logic.

FIG. 2 illustrates one embodiment of an implementation of an original XOR cell 200 using CMOS logic. FIG. 3 illustrates one embodiment of an implementation of an inverse-redundant (IR) XNOR cell 300 (with inputs ai, bi) operating on the inverse data signals in a combined-dual-inverse-redundant (CDIR) logic (ai, bi) cell using CMOS logic. The implementation of the IR XNOR gate 300 shown in FIG. 3 fulfills the criterion above.

Figure 5:
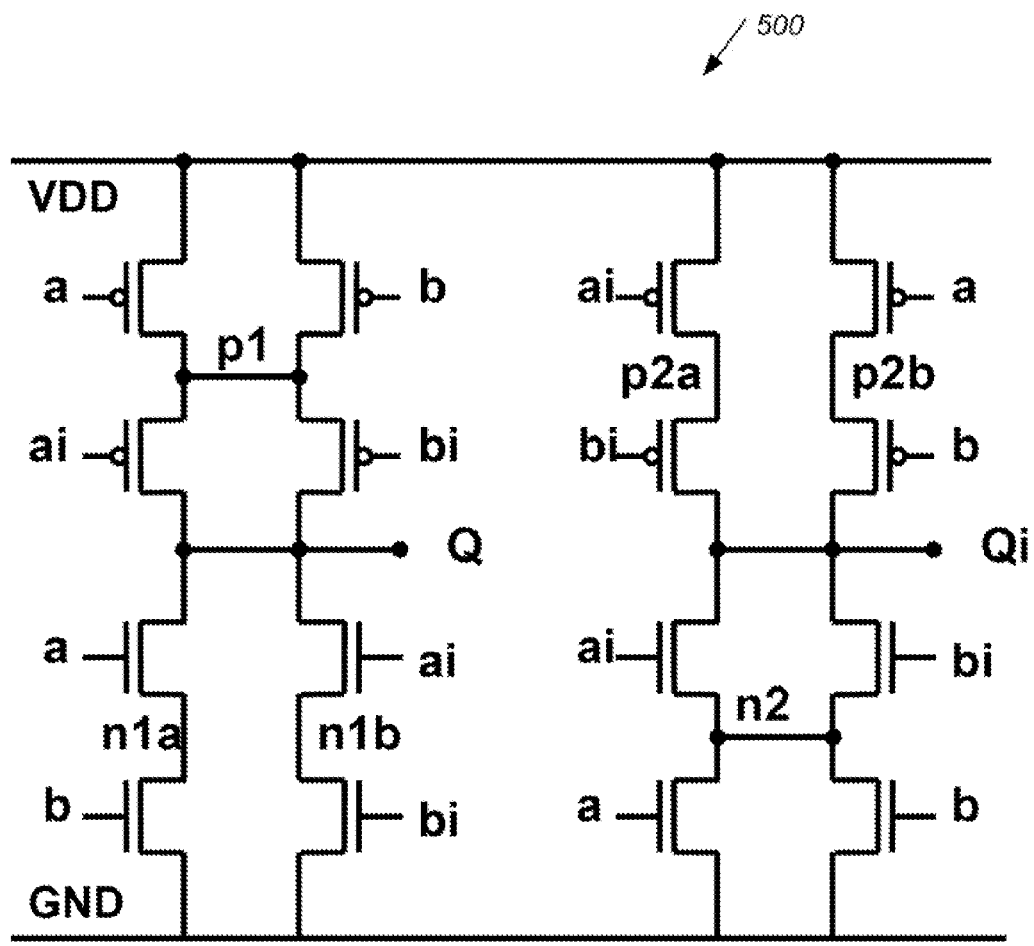
FIG. 5 is a schematic of one implementation of a completed CMOS based CDIR XOR cell.

The error analysis according to the procedure disclosed above has been carried out for the IR XNOR gate 300 shown in FIG. 3. FIG. 4 is a table 400 that tabulates an error analysis for an XOR CDIR circuit using a procedure in accordance with one embodiment. An error (bold and centered number) is injected on each of the inputs for each circuit state of the IR XNOR gate 300. In the right two columns the output is evaluated, and an erroneous output is shown in bold with centered number. As can be seen at the right portion of the table 400 shown in FIG. 4, the criterion is fulfilled: in none of the cases does one input error generate an error on both outputs. Since the criterion is fulfilled, the input inverters in the original XOR cell 200 and the IR XNOR gate 300 can be removed by replacing $a^{inv}$ by ai, and $b^{inv}$ by bi, in the original gate, and by replacing $ai^{inv}$ by a, and $bi^{inv}$ by b, in the IR XNOR gate 300 circuit. FIG. 5 is a schematic of one implementation of a completed CMOS based CDIR XOR cell 500 (after removal of the input inverters by replacing $a^{inv}$ by ai, and $b^{inv}$ by bi, in the original gate, and by replacing $ai^{inv}$ by a, and $bi^{inv}$ by b, in the IR XNOR gate 300 circuit.

Figure 6:
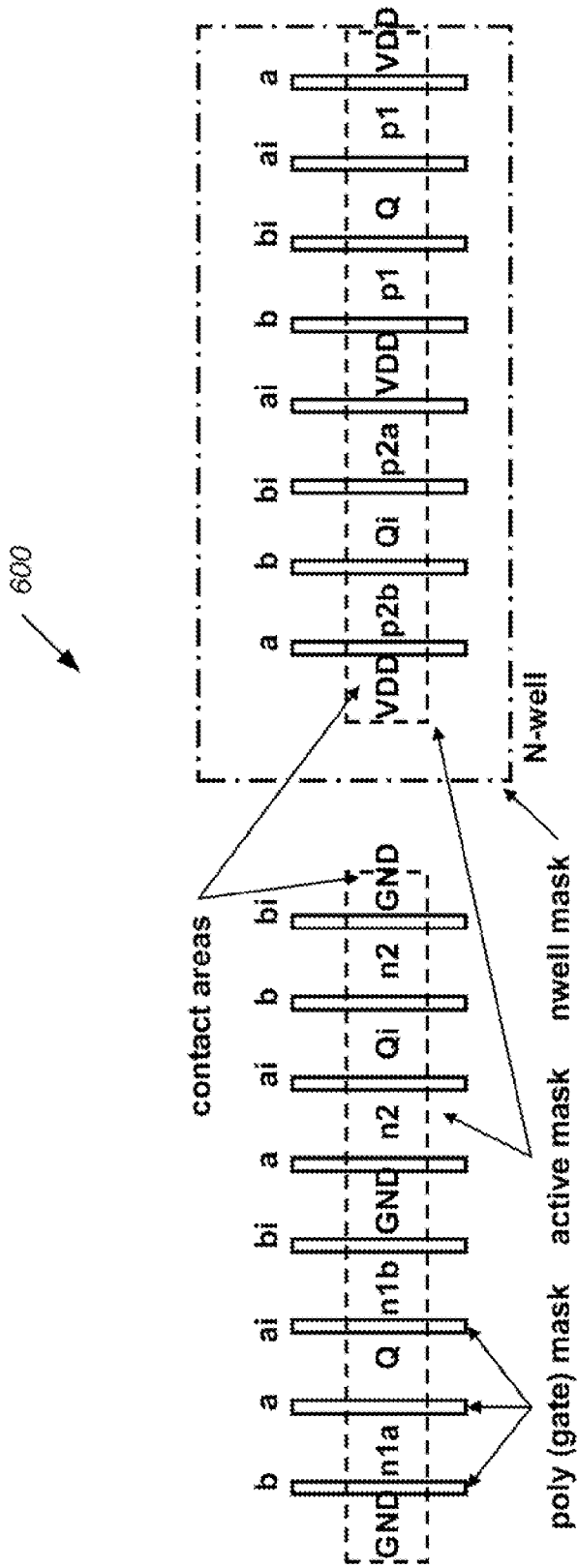
FIG. 6 is one embodiment of a layout for the CMOS based CDIR XOR cell shown in FIG. 5.

A layout is now generated for the combined CMOS based CDIR XOR cell 500 using the general methodology disclosed in U.S. patent application Ser. No. 12/354,655. The resulting (principle) layout is shown in FIG. 6, which illustrates one embodiment of a layout for the CMOS based CDIR XOR cell shown in FIG. 5. While the individual circuit (the original and the IR circuit in most cases, will be a known circuits), their combination to a circuit that implements the CDIR logic, and their combined layout according to the methodology disclosed in U.S. patent application Ser. Nos. 12/354,655 and 12/763,139, provides a novel and unique integrated circuit which has very special properties with respect to single event generated soft errors.

In one embodiment, the methodology disclosed in U.S. patent application Ser. Nos. 12/354,655 and 12/763,139 provides a duplicated combinational circuit. The duplicated combinational circuit carries a primary and a redundant copy of the data signal, the redundant signal being the inverse of the primary signal, and where each logic gate consists of a regular logic gate, operating on the primary signal, and of an inverse logic gate, being the inverse of the regular logic gate, operating on the redundant (inverse) signal, the inverse logic gate, having the function provided by inverting every signal in the truth-table for the regular logic gate. The duplicated combinational circuit includes a layout arrangement where a the combined regular and inverse logic gate is laid out such that there is no straight line between two contact areas in the layout, for which a single event have the same effect on the state of the circuit, unless there is another contact area in between the first two contact areas, for which a single event has the opposite effect on the state of the circuit, i.e., if a single event affecting a first contact area has the effect of creating an error on the primary signal, and a single event on a second node has the effect of creating an error on the redundant (inverse signal), then one, or more, third contact areas, for which a single event has the opposite effect of the that on the first or second contact areas, should be placed in between the first and second contact areas. Black full line stripes are the gate shapes (annotated, on top, with the circuit node, from FIG. 5, that they are connected to). The dashed shapes are the active regions, and the position of each source/drain contact area is annotated with the contact node, from FIG. 5, to which it is connected. The devices inside the dashed-dotted line are the p-type MOSFETs (inside the n-well) and the ones outside this regions (to the left) are the n-type MOSFETs.

Figure 7:
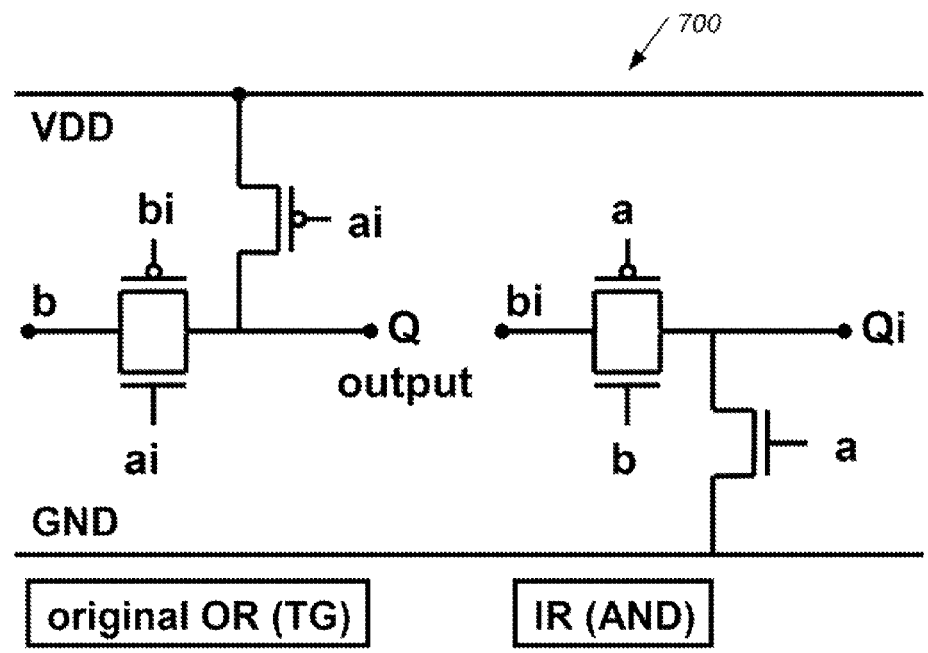
FIG. 7 is a schematic of one implementation of a completed CMOS based CDIR OR circuit using transmission gates.
Figure 8:
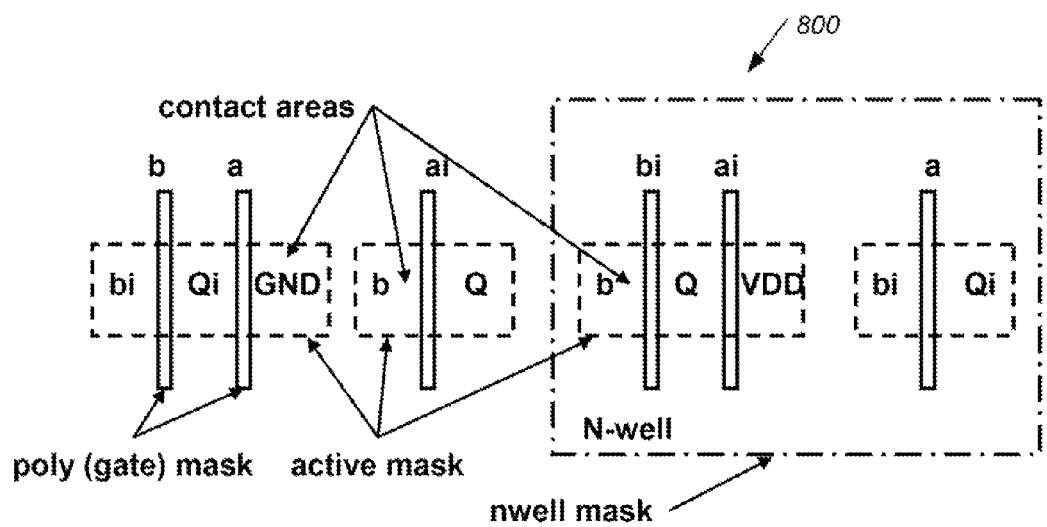
FIG. 8 is a layout for a transmission gate of the CMOS based CDIR OR circuit sown in FIG. 7.

An explicit transmission gate based OR circuit, generated in the same way as the CMOS based XOR circuit above is also part of one embodiment of the invention. This circuit and its principle layout is shown in FIGS. 7 and 8, where FIG. 7 is one embodiment of a schematic of one implementation of a completed CMOS based CDIR OR circuit using transmission gates. With this original OR gate and this IR gate (which implements the AND function on the inverse of the inputs of the original gate), the criterion for use with the CDIR logic is fulfilled (and inverters removed from both original and IR circuits).

FIG. 8 is one embodiment of a layout for a transmission gate of the CMOS based CDIR OR circuit sown in FIG. 7. In one embodiment, the layout for the transmission gate can be generated using the general methodology disclosed in U.S. patent application Ser. No. 12/354,655 as discussed above for in connection with FIG. 6. Black full line stripes are the gate shapes (annotated, on top, with the circuit node, from FIG. 7, that they are connected to). The dashed shapes are the active regions, and the position of each source/drain contact area is annotated with the contact node (from FIG. 7) to which it is connected. The devices inside the dashed-dotted line are the p-type MOSFETs (inside the n-well) and the ones outside this regions (to the left) are the n-type MOSFETs.

Figure 9:
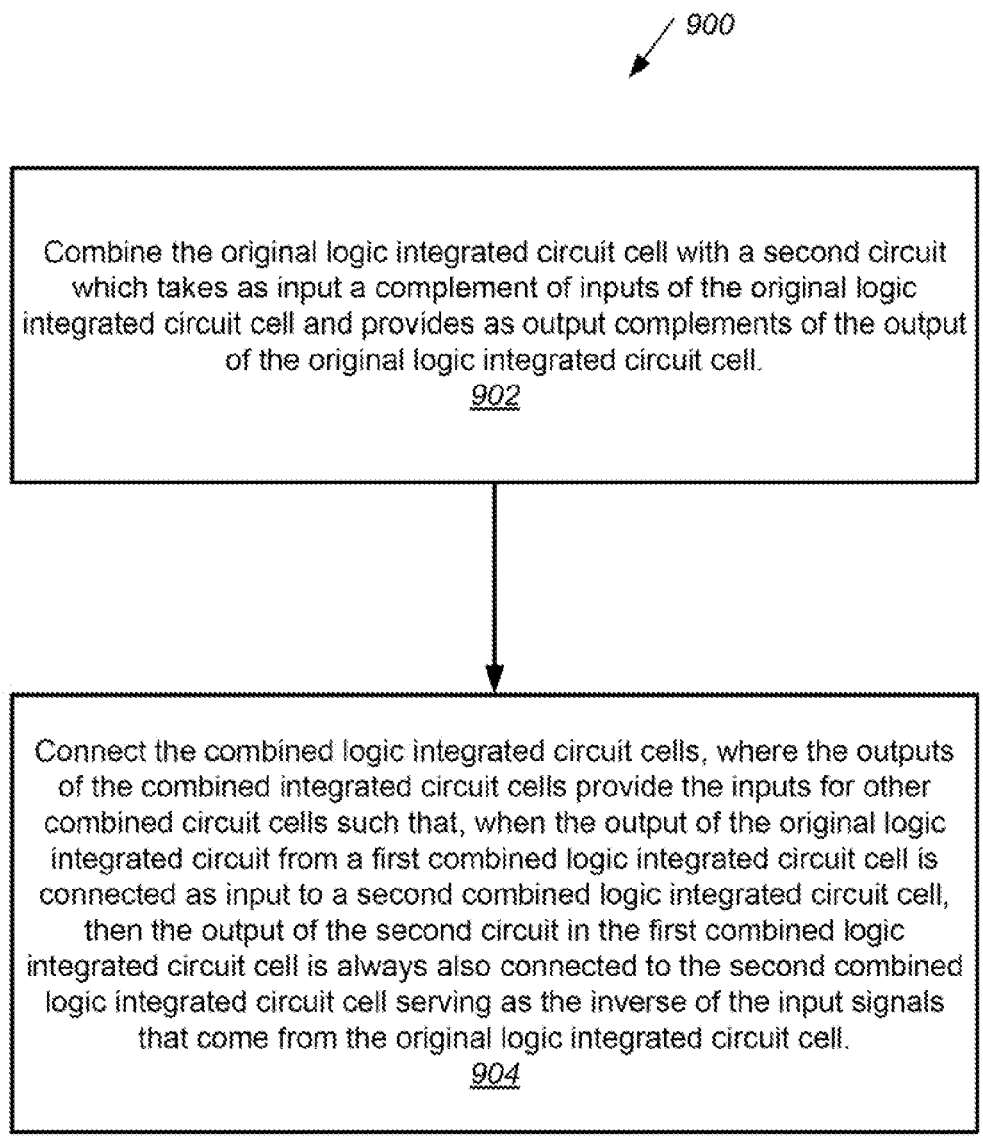
FIG. 9 is one embodiment of a computer-implemented method of creating a logic integrated circuit cell from an original logic integrated circuit cell in accordance with one embodiment of the present invention.

FIG. 9 is one embodiment of a computer-implemented method 900 of creating a logic integrated circuit cell from an original logic integrated circuit cell in accordance with the present invention. At 902, the method 900 comprises combining the original logic integrated circuit cell with a second circuit which takes as input a complement of inputs of the original logic integrated circuit cell and provides as output complements of the output of the original logic integrated circuit cell. At 904, the method further comprises connecting the combined logic integrated circuit cells, where the outputs of the combined integrated circuit cells provide the inputs for other combined circuit cells such that, when the output of the original logic integrated circuit from a first combined logic integrated circuit cell is connected as input to a second combined logic integrated circuit cell, then the output of the second circuit in the first combined logic integrated circuit cell is always also connected to the second combined logic integrated circuit cell serving as the inverse of the input signals that come from the original logic integrated circuit cell.

Figure 10:
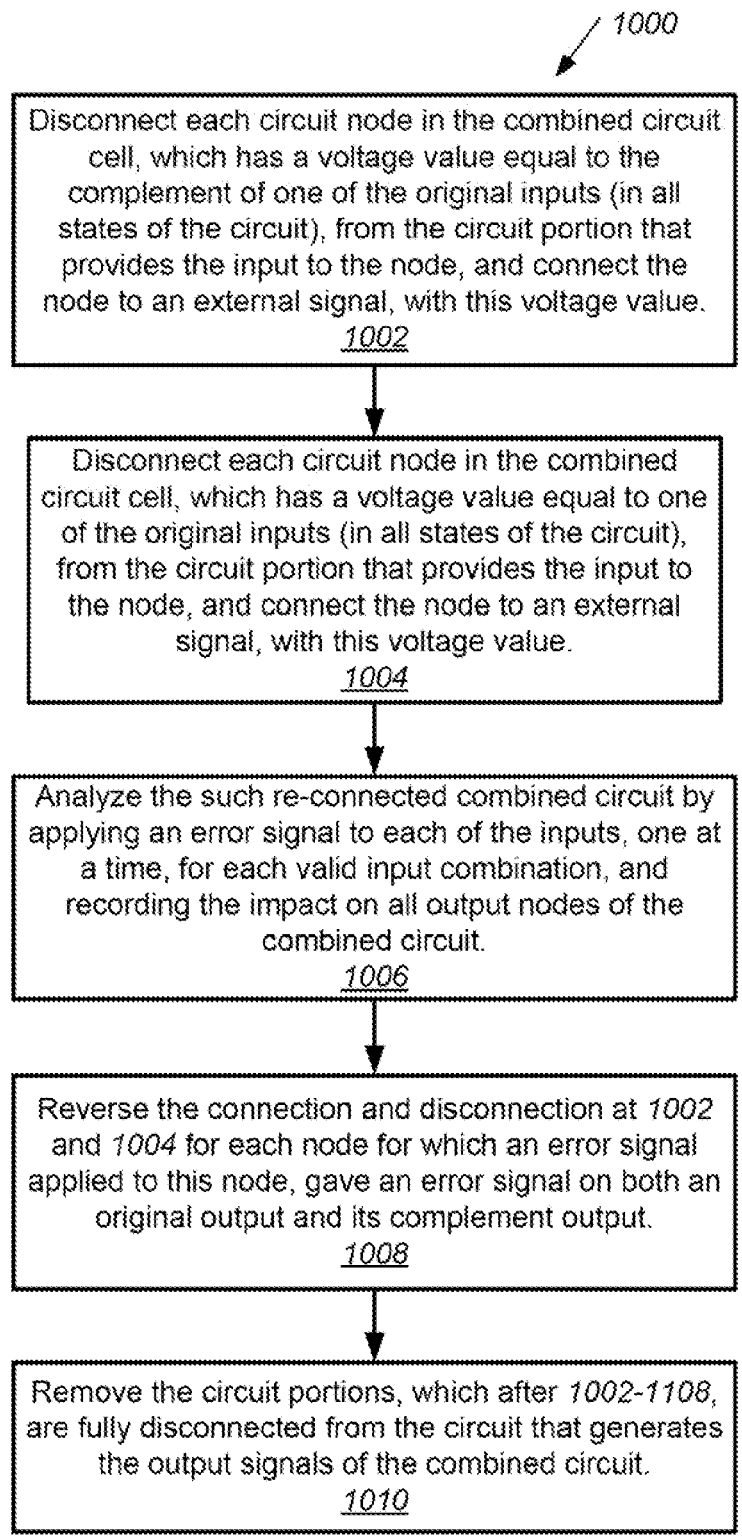
FIG. 10 is one embodiment of a computer-implemented method of simplifying the combined circuit cell obtained at in FIG. 9.

FIG. 10 is one embodiment of a computer-implemented method 1000 of simplifying the combined circuit cell obtained at 902 in FIG. 9. According to the computer-implemented method 1000, the combined circuit can be simplified as follows. At 1002, disconnecting each circuit node in the combined circuit cell, which has a voltage value equal to the complement of one of the original inputs (in all states of the circuit), from the circuit portion that provides the input to the node, and connecting the node to an external signal, with this voltage value. At 1004, disconnecting each circuit node in the combined circuit cell, which has a voltage value equal to one of the original inputs (in all states of the circuit), from the circuit portion that provides the input to the node, and connecting the node to an external signal, with this voltage value. At 1006, analyzing the such re-connected combined circuit by applying an error signal to each of the inputs, one at a time, for each valid input combination, and recording the impact on all output nodes of the combined circuit. At 1008, reversing the connection and disconnection at 1002, 1004 for each node for which an error signal applied to this node, gave an error signal on both an original output and its complement output. At 1010, removing the circuit portions, which after 1002-1108, are fully disconnected from the circuit that generates the output signals of the combined circuit.

In one embodiment, a physical layout for a semiconductor integrated circuit is provided. The physical layout implements the circuit in accordance with computer-implemented methods 900 and 1000, generated according to the layout method disclosed in U.S. patent application Ser. No. 12/354,655, as disclosed herein. The integrated circuit comprising a physical arrangement where the contact areas of devices have been placed along a line in a substrate, and where n-type contact areas, which are connected to output(s) (q) of an original circuit (n-q), and connected to output(s) (qi) of a second circuit (n-qi), and p-type contact areas which are connected to q (p-q) and to qi (p-qi) are ordered along the line in such a way that in-between an n-q node and a p-qi node, there is always at least one n-qi node and/or at least one p-q node, and that in-between an n-qi node and a p-q node there is always at least one n-q node and/or at least one p-qi node. Possible orderings include, without limitation, [n-q, n-qi, p-qi, p-q], [n-q, n-qi, n-q, n-qi, p-qi, p-q, p-qi, p-q], [p-q, n-q, n-qi, p-qi], [n-q, p-q, p-qi, n-qi].

In one embodiment, a circuit cell is provided that implements an exclusive OR (XOR) logic function using CMOS technology. The physical layout of the circuit is implemented in accordance with computer-implemented methods 900 and 1000 and is generated according to the layout method disclosed in U.S. patent application Ser. No. 12/354,655, as described herein. The CMOS based XOR logic function comprises 8 n-type MOSFET devices, and eight p-type MOSFET devices, four input signals a, b, ai, bi, wherein ai is the inverse complement of a, and bi is the inverse complement of b. A power node, VDD, is connected to the HIGH voltage for the logic, and a ground node, GND, is connected to LOW voltage for the logic. Two output nodes, q, and qi, wherein qi is the inverse complement of q. The CMOS based XOR logic function further comprises a connection of the devices such that the output node q provides the XOR function of the two inputs a and b, and the output node qi provides the complement of the exclusive or function (NXOR), on the two inputs ai and bi.

In another embodiment, the CMOS based XOR logic function further comprises a circuit cell comprising six internal circuit nodes p1, n1a, n1b, p2a, p2b, n2, connected between the MOSFET devices. A connection is provided between the eight p-type MOSFETs, where the (source, gate, drain) nodes are connected as follows: (vdd, a, p1), (vdd, b, p1), (p1, ai, q), (p1, bi, q), (vdd, a1, p2a), (vdd, a, p2b), (p2a, bi, qi), (p2b, b, qi). A connection is provided between the eight n-type MOSFETs, where the (source, gate, drain) nodes are connected as follows: (gnd, b, n1a), (gnd, b1, n1b), (n1a, a, q), (n1b, ai, q), (gnd, a, n2), (gnd, b, n2), (n2, ai, qi), (n2, bi, qi). Any other connection between the devices which gives the XOR function on the inputs a and b on node q, and the complement of the XOR function on the inputs ai and bi on the node qi. A physical layout arrangement where the contact areas are ordered along a line in the layout according to the physical layout implements the circuit in accordance with computer-implemented methods 900 and 1000, generated according to the layout method disclosed in U.S. patent application Ser. Nos. 12/354,655 and 12/763,139, as disclosed herein. A physical layout arrangement is provided where the contact areas are ordered along a line in the layout with the following order: [gnd, n1a, n-q, n1b, gnd, n2, n-q1, n2, gnd, vdd, p2b, p-q1, p2a, vdd, p1, p-q, p1, vdd]

In one embodiment, a circuit cell is provided that implements an OR logic function using transmission gate MOSFET technology. The physical layout of the OR circuit cell is implemented in accordance with computer-implemented methods 900 and 1000 and is generated according to the layout method disclosed in U.S. patent application Ser. No. 12/354,655, as described herein. The OR circuit cell which implements the OR logic function using transmission gate MOSFET technology comprises three n-type MOSFET devices, and three p-type MOSFET devices, four input signals a, b, ai, bi, whereby ai is the inverse complement of a, and bi is the inverse complement of b. A power node, VDD, is provided which is connected to the HIGH voltage for the logic, and a ground node, GND, which is connected to LOW voltage for the logic. Two output nodes, q, and qi, are provided where qi is the inverse complement of q. A connection of the devices is provided such that the output node q provides the OR logic function of the two inputs a and b, and the output node qi provides the complement of the OR logic function (AND), on the two inputs ai and bi.

In one embodiment, the circuit cell is provided that implements an OR logic function using transmission gate MOSFET technology further comprises a connection between the three p-type MOSFETs, where the (source, gate, drain) nodes are connected as follows: (vdd, ai, q), (b, bi, q), (bi, a, qi). A connection between the eight n-type MOSFETs, where the (source, gate, drain) nodes are connected as follows: (gnd, a, qi), (bi, b, qi), (b, ai, q). Any other connection between the devices which gives the OR logic function on the inputs a and b on node q, and the complement of the OR function on the inputs ai and bi on the node qi. A physical layout arrangement where the contact areas are ordered along a line in the layout that implements the circuit in accordance with computer-implemented methods 900 and 1000, generated according to the layout method disclosed in U.S. patent application Ser. No. 12/354,655, as disclosed herein. A physical layout arrangement where the contact areas are orders along a line in the layout with the following order: [n-bi, n-qi, gnd, n-b, n-q, p-b, p-q, vdd, p-bi, p-qi], where n-denotes contact areas of n-type MOSFETs, and p-denotes contact areas of p-type MOSFETs.

Layout Methodology According to U.S. patent application Ser. No. 12/763,139

Figure 11:
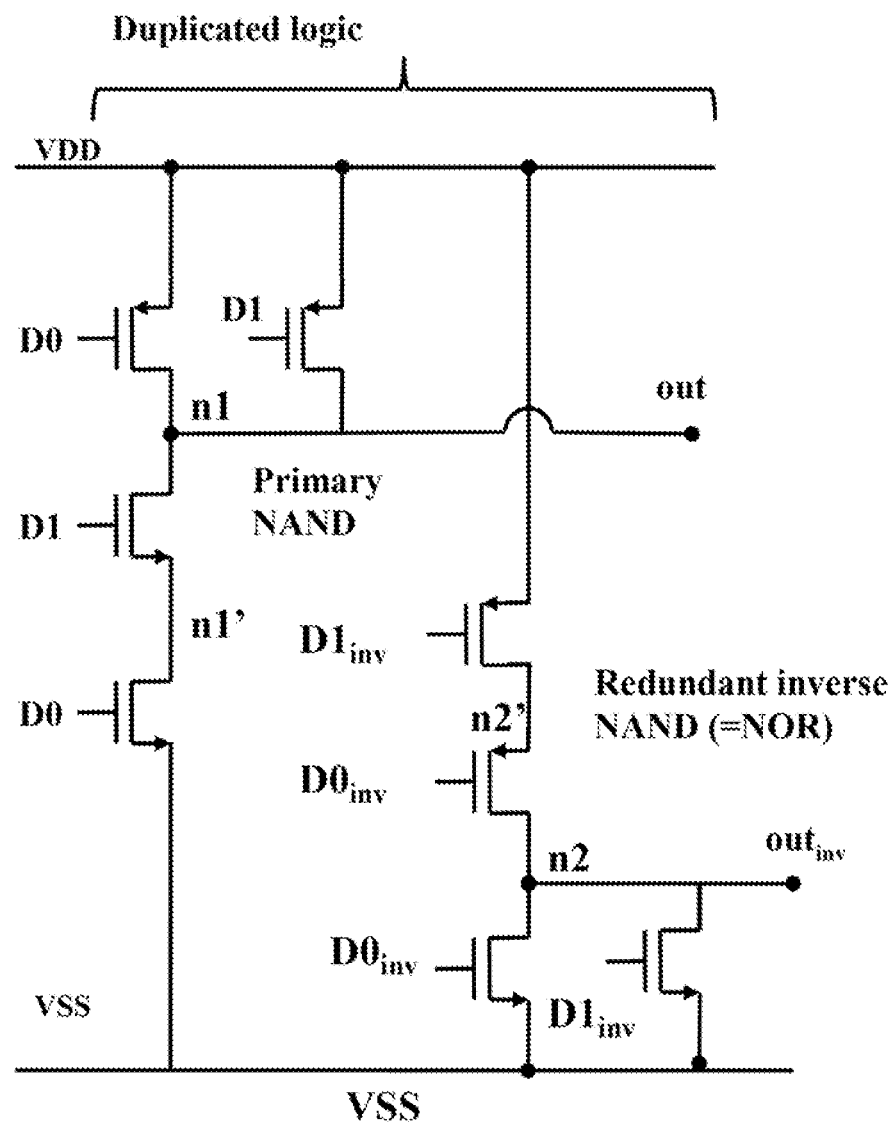
FIG. 11 is one embodiment of a duplicated logic carrying the signal and its inverse, i.e., a NAND gate and the inverse NAND gate (i.e., a NOR gate).
Figure 12:
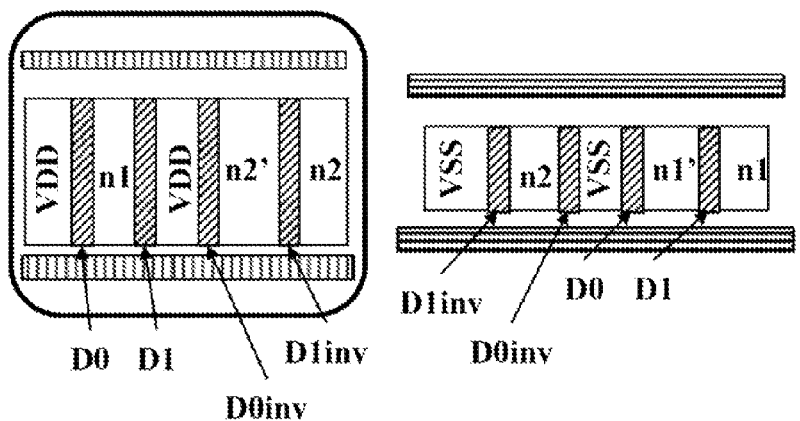
FIG. 12 is a principal layout, using the layout technique according to one embodiment of the invention, for the duplicated NAND gate from FIG. 11.

One embodiment, the layout methodology to combinational logic disclosed in U.S. patent application Ser. No. 12/763,139 uses redundant logic. Based on that method, a particular way to construct such redundant logic gates from regular (non-redundant) logic gates is provided. Once such a redundant gate has been constructed it can be laid out using the layout methodology in U.S. patent application Ser. No. 12/354,655. A specific redundant NAND gate, constructed in this way, and its principal layout configuration is disclosed. The duplicated redundant NAND gate netlist and principal layout are shown in FIGS. 11 and 12, respectively, where FIG. 11 is one embodiment of a duplicated logic carrying the signal and its inverse, i.e., a NAND gate and the inverse NAND gate (i.e., a NOR gate) and FIG. 12 is a principal layout, using the layout technique according to one embodiment of the invention, for the duplicated NAND gate from FIG. 11.

Figure 13:
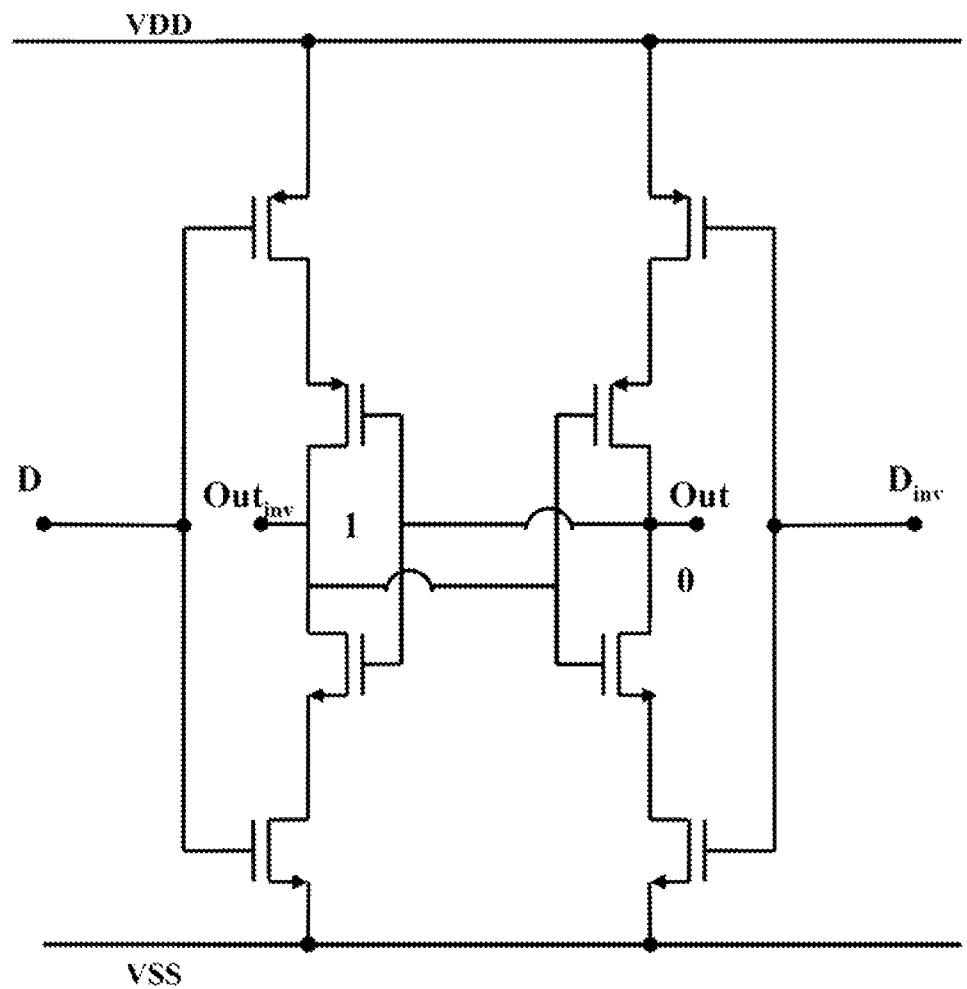
FIG. 13 is a filter cell for dual inverse logic, where the two output nodes are numbered 0 (out) and 1 ($out_{inv}$).
Figure 14:
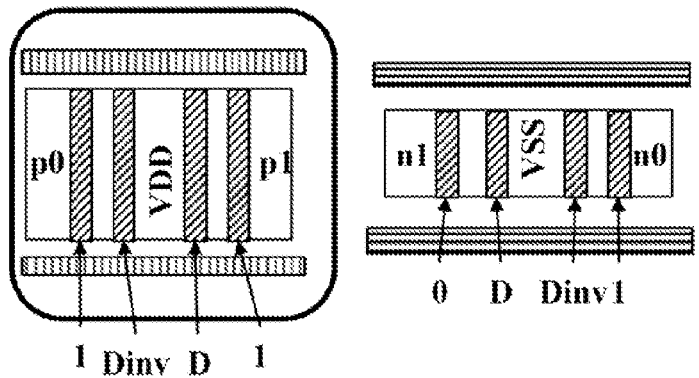
FIG. 14 is a layout using the layout methodology for the filter shown in FIG. 13, where n0 and p0 are the n-type and p-type drain contact area of the output node 0 (out), respectively, and n1 and p1 are the n-type and p-type drain contact area of the output node 1 ($out_{inv}$), respectively.

When a duplicated logic is used, then either errors need to be filtered before they are latched into sequential elements, or, alternatively, both combinational logic and sequential elements are duplicated for portions of the circuit, and at the output of this circuit portion the error can be detected. In the latter case, the error is not automatically corrected, but rather some other means to correct the error must be invoked, e.g., a repeat of the activity in the circuit portion that generated the error. In the former case, a filter is applied before every latch, which only allows the latch to read in data only when the two duplicated signal are (correctly) the inverse of each other. One way to accomplish such filtering is by using the filtering DICE latch described above. Alternatively it may be advantageous to introduce a stand-alone filter, either prior to a regular latch, or somewhere else in the chain of combinational logic. This filter should be such that a signal is only allowed to pass when the two inputs are (correctly) the inverse of each other. If the two input signals are the same, the filter should block the signal. The netlist using two coupled c-elements (FIG. 13), where the output of one c-element is coupled to one of the inputs of the other c-element, is a way to realize such a filter. This filter circuit is such that it can be laid out according to the new layout methodology, making the filter itself hard to single event upsets. The combined circuit (FIG. 13) and layout (FIG. 14) of this filter is part of one embodiment of this invention, where FIG. 13 is a filter cell for dual inverse logic, where the two output nodes are numbered 0 (out) and 1 (out$_{inv}$) and FIG. 14 is a layout using the layout methodology for the filter shown in FIG. 13, where n0 and p0 are the n-type and p-type drain contact area of the output node 0 (out), respectively, and n1 and p1 are the n-type and p-type drain contact area of the output node 1 (out$_{inv}$), respectively.

An alternative to a duplication of the logic signal is to use triple mode redundancy (TMR), in which three copies of the same logic signal is carried by three copies of the logic gates, and a voting among the three signals is applied to correct errors to one of the three signal copies. In such circuits a voting circuit needs to be used, which itself should be very hard against single event errors. One embodiment of the invention entails two different interleaved DICE-type latches, which takes three signals as input and performs a voting on these three signals upon latching in a new data. If one of the three input signals has an error, i.e., is different from the other two, these latches will, upon closing (switching from open (transparent) to closed (opaque)) correct the erroneous input signal. Both these voting latches are such that they effectively can be laid out using the layout methodology of U.S. patent application Ser. No. 12/354,655.

Figure 15:
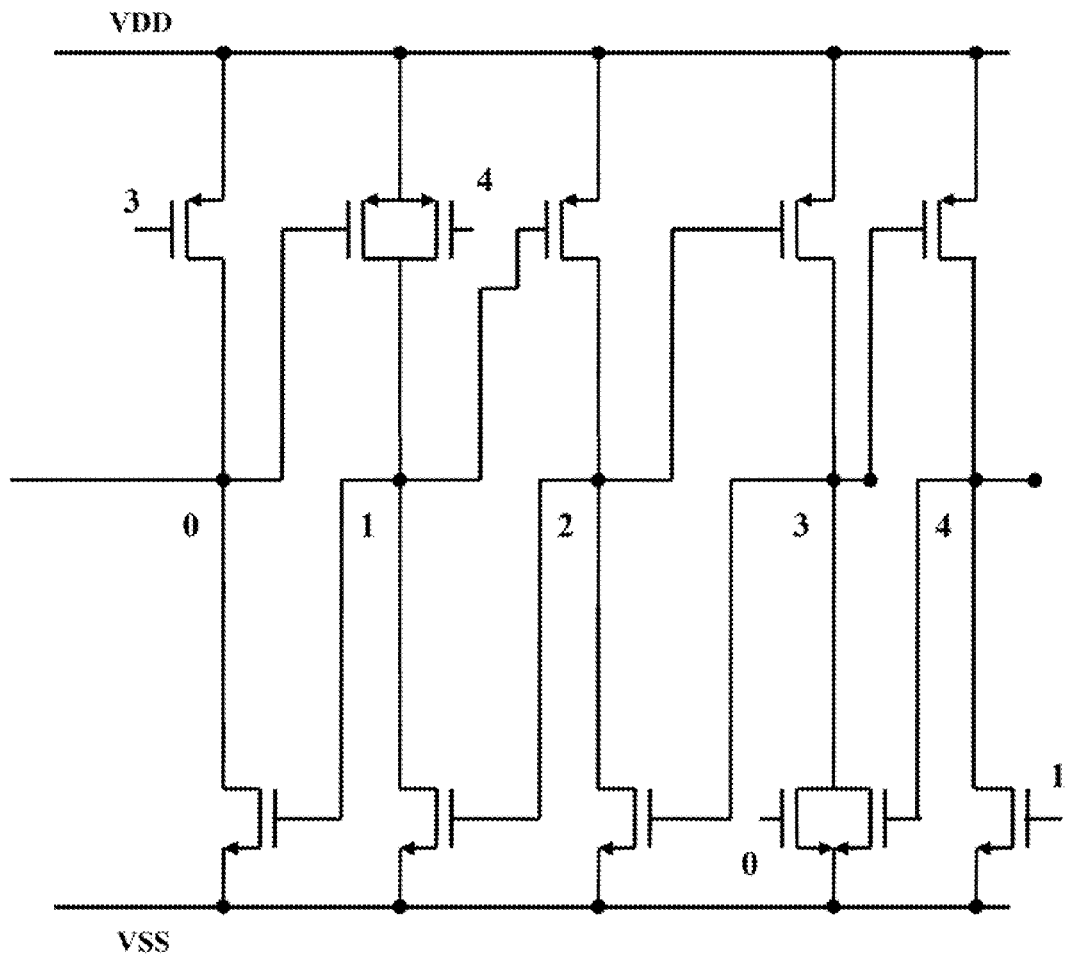
FIG. 15 is a basic Double Dual interlocked cell (DICE) latch for a voting circuit.
Figure 16:
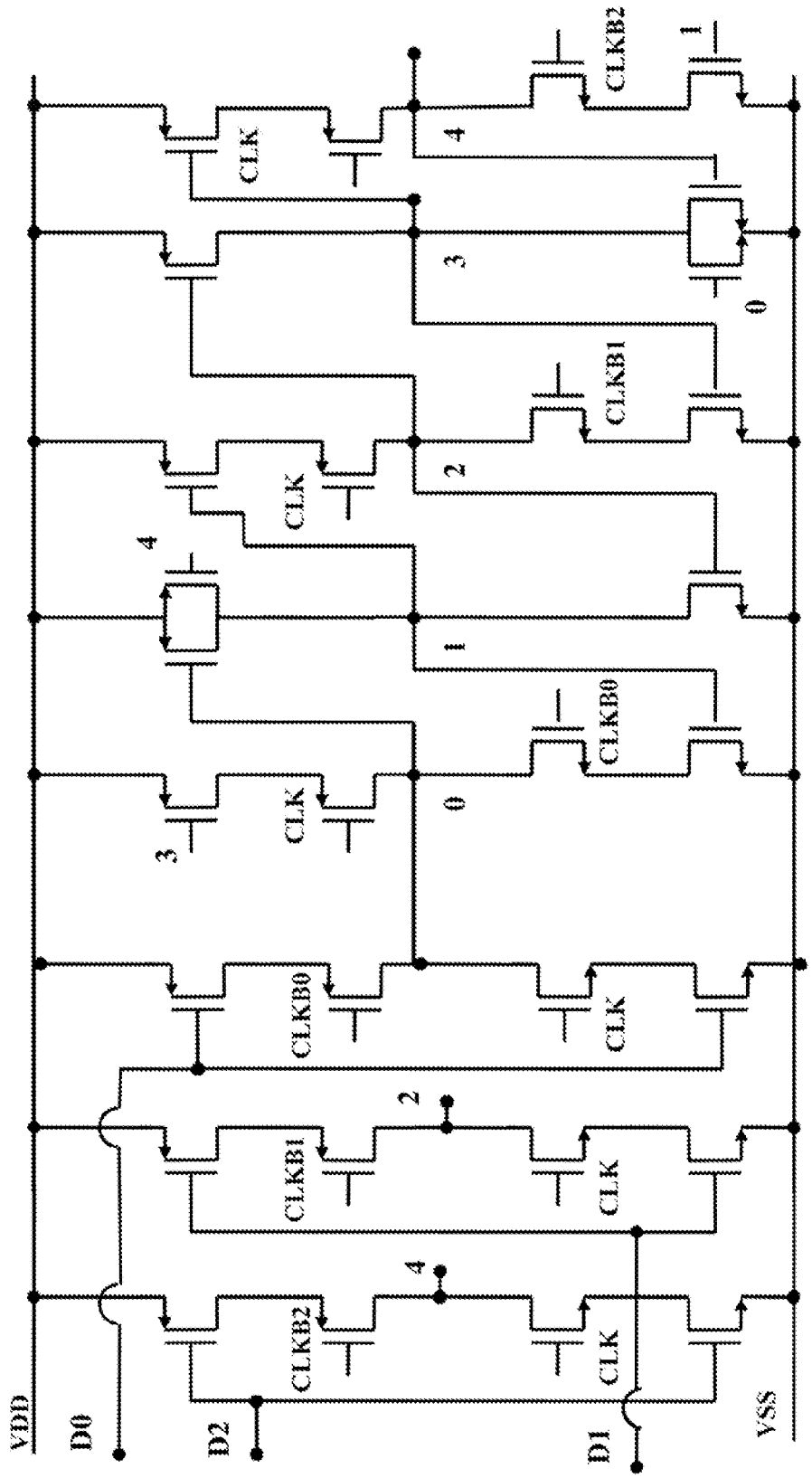
FIG. 16 is Double Dual interlocked cell (DICE) latch with voting including a first variant to introduce clocking D and Dinv.
Figure 17:
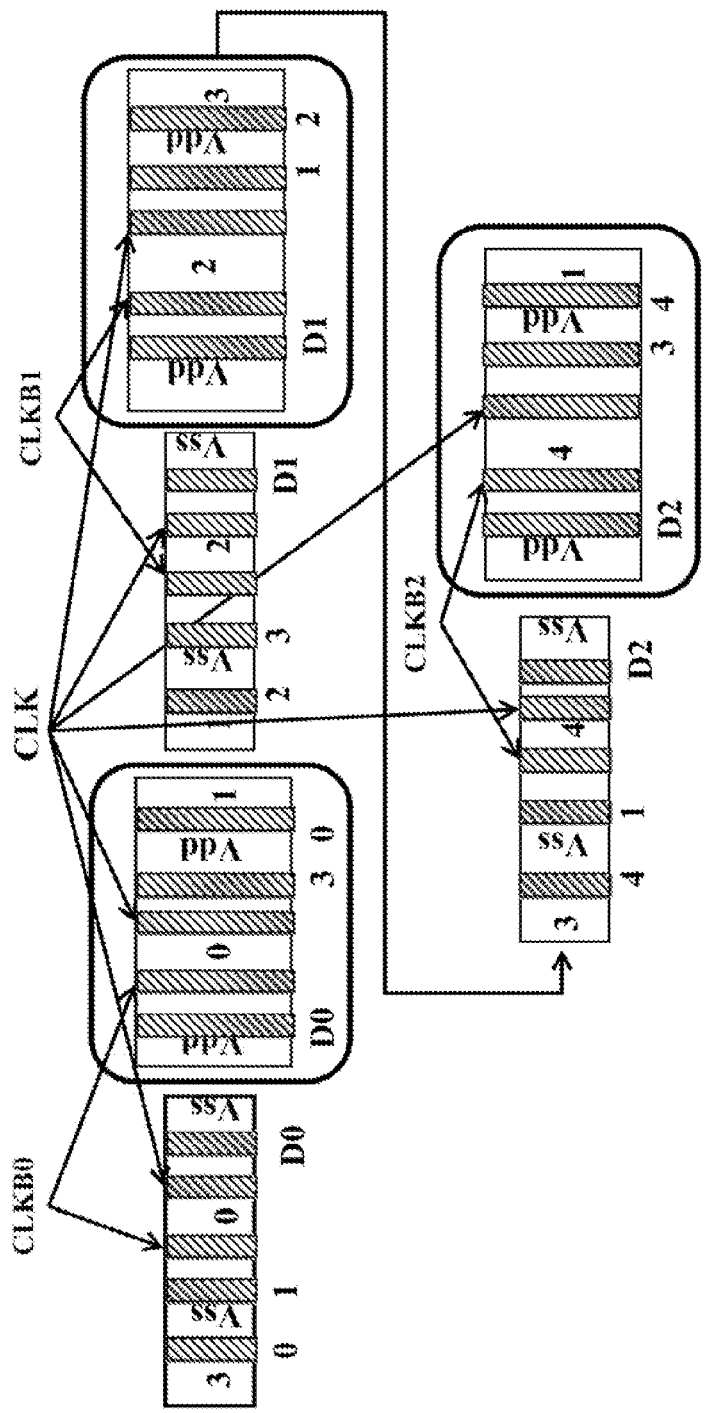
FIG. 17 is a possible arrangement of the nodes in the double DICE voting circuit from the schematics in FIG. 16.

FIG. 15 is a basic Double Dual interlocked cell (DICE) latch for a voting circuit. FIG. 16 is Double Dual interlocked cell (DICE) latch with voting including a first variant to introduce clocking D, and Dinv, are the data input and inverse of data input, respectively, CLK is the clock, and CLKB0, CLKB1 and CLKB2 are the inverse of the CLK. The inverse of the CLK is here included as three separate signals CLKB0, CLKB1 and CLKB2, the claims also cover the case where CLKB0, CLKB1 and CLKB2 are the same signal (or interchanged with respect to how they are connected into the circuit). FIG. 17 is a possible arrangement of the nodes in the double DICE voting circuit from the schematics in FIG. 16, where the nodes n0-n4 are the n-type MOSFET drains, and p0-p4 the p-type MOSFET drains, that are connected to node 0-4 respectively, and where cyclic permutation of the nodes included in the claims, as well as any position switch of any two odd p-drain, odd n-drain, even p-drain, even n-drain node pairs. The basic netlist (without clocking transistors) of the first voting latch is shown in FIG. 15. It consists of two inter-coupled DICE latches, which share three storage nodes. FIG. 16 shows the same voter circuit, but with added MOSFETs to accomplish the clocking. A layout for this voting latch, generated according to the methodology in U.S. patent application Ser. No. 12/354,655, is shown in FIG. 17.

Figure 18:
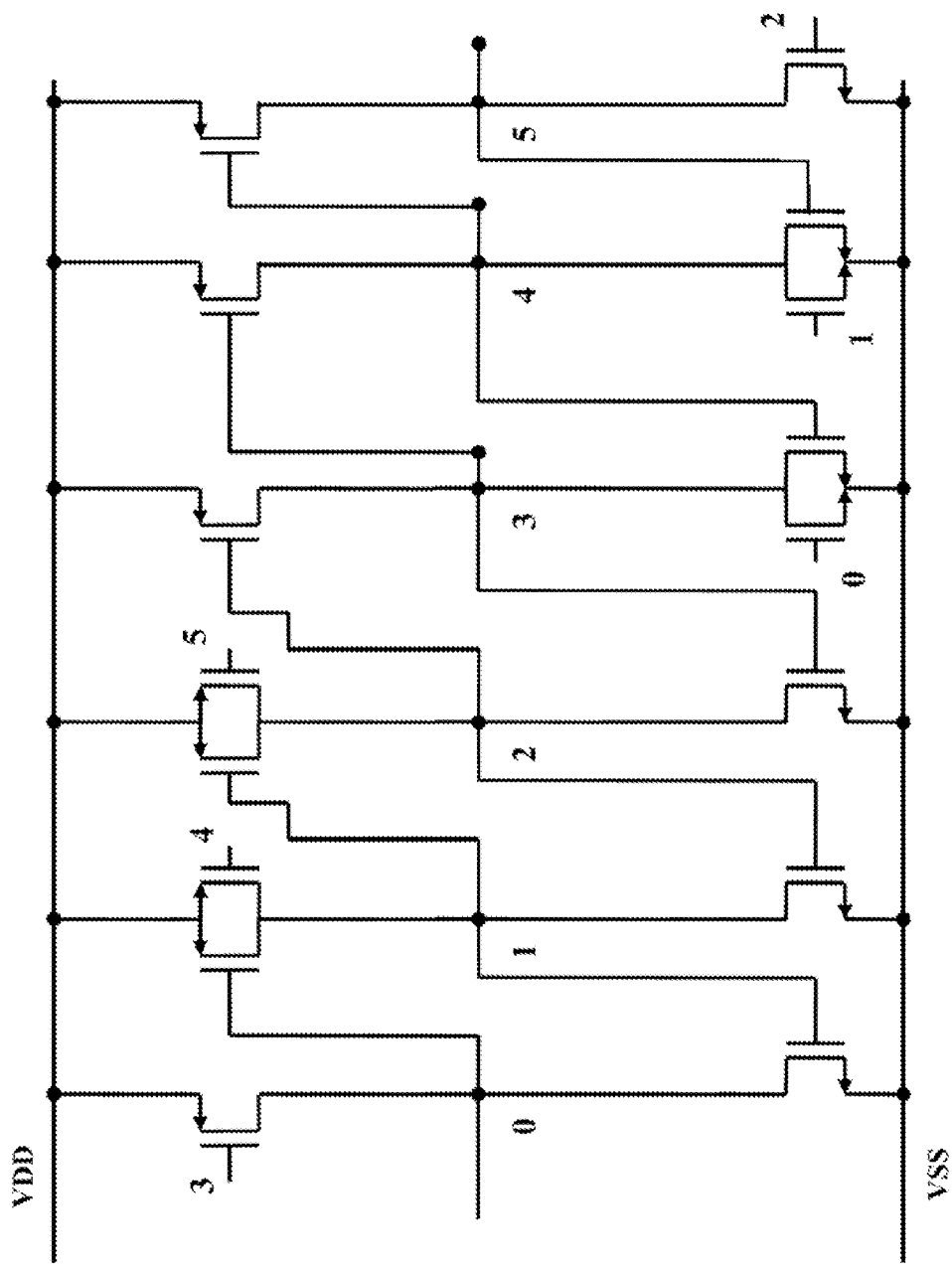
FIG. 18 is a basic Triple Dual interlocked cell (DICE) latch for a voting circuit.

FIG. 18 is a basic Triple Dual interlocked cell (DICE) latch for a voting circuit. The basic netlist (without clocking transistors) of the second voting latch is shown in FIG. 18. It consists of six storage nodes, forming a three inter-coupled DICE latches, each consisting of four non-identical storage nodes and where the first latch share three nodes with the second latch, and two nodes with the third latch, and the second and third latch share three nodes. Whenever in the construction of each DICE connection, two different nodes need to be connected to the same gate, then the MOSFET of this gate is replaced by tow parallel MOFETS of the same type, and each of the two signals is connected to the gates of one of these parallel MOSFETs, so that no two nodes are connected to the same gate. For this second voting latch, it is possible to introduce the clocking by using only MOSFETs of one type, which better preserves the symmetry of the original circuit.

Figure 19:
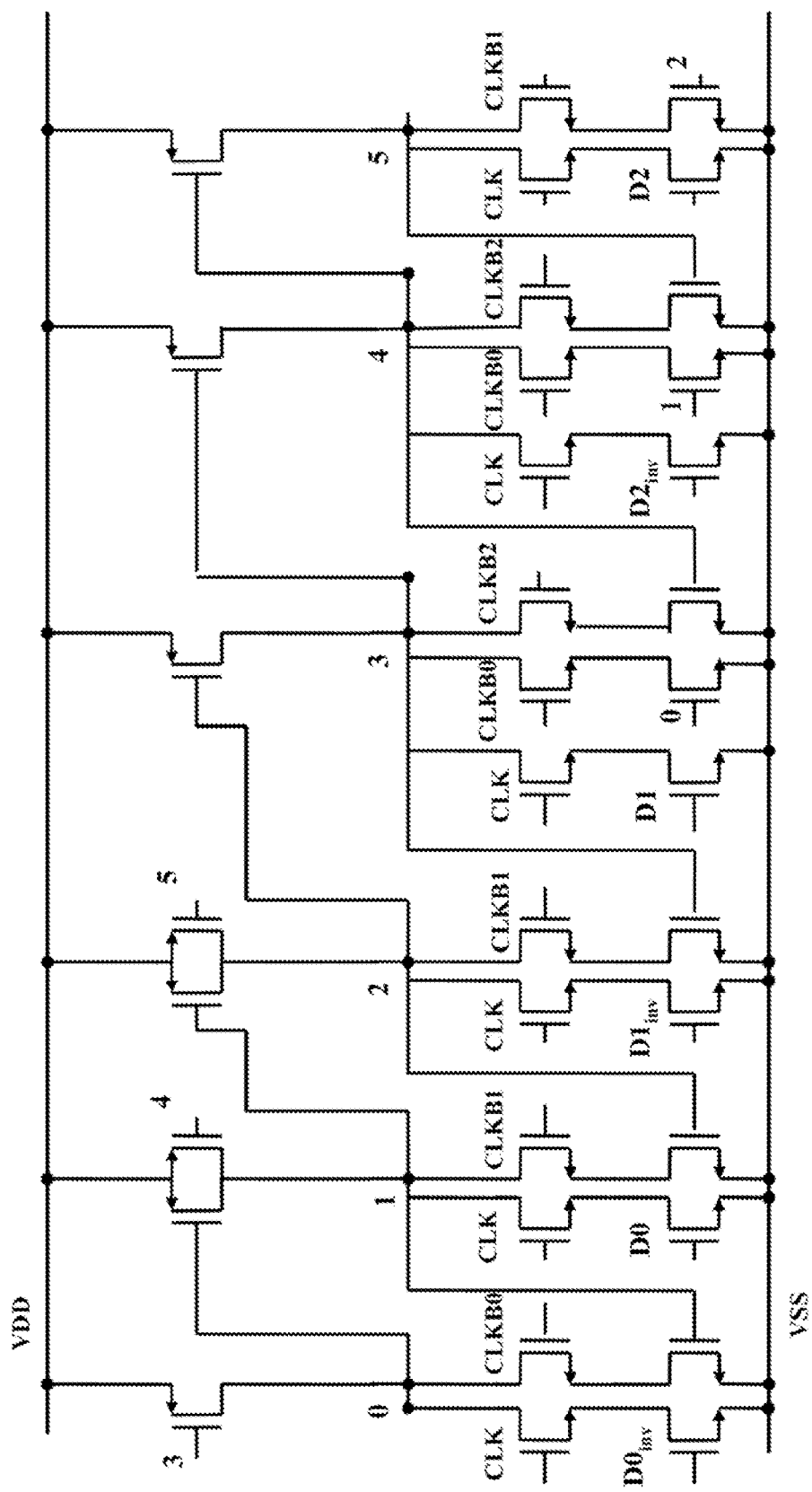
FIG. 19 is a Triple Dual interlocked cell (DICE) latch with voting including a first variant to introduce symmetric clocking D and Dinv.
Figure 20:
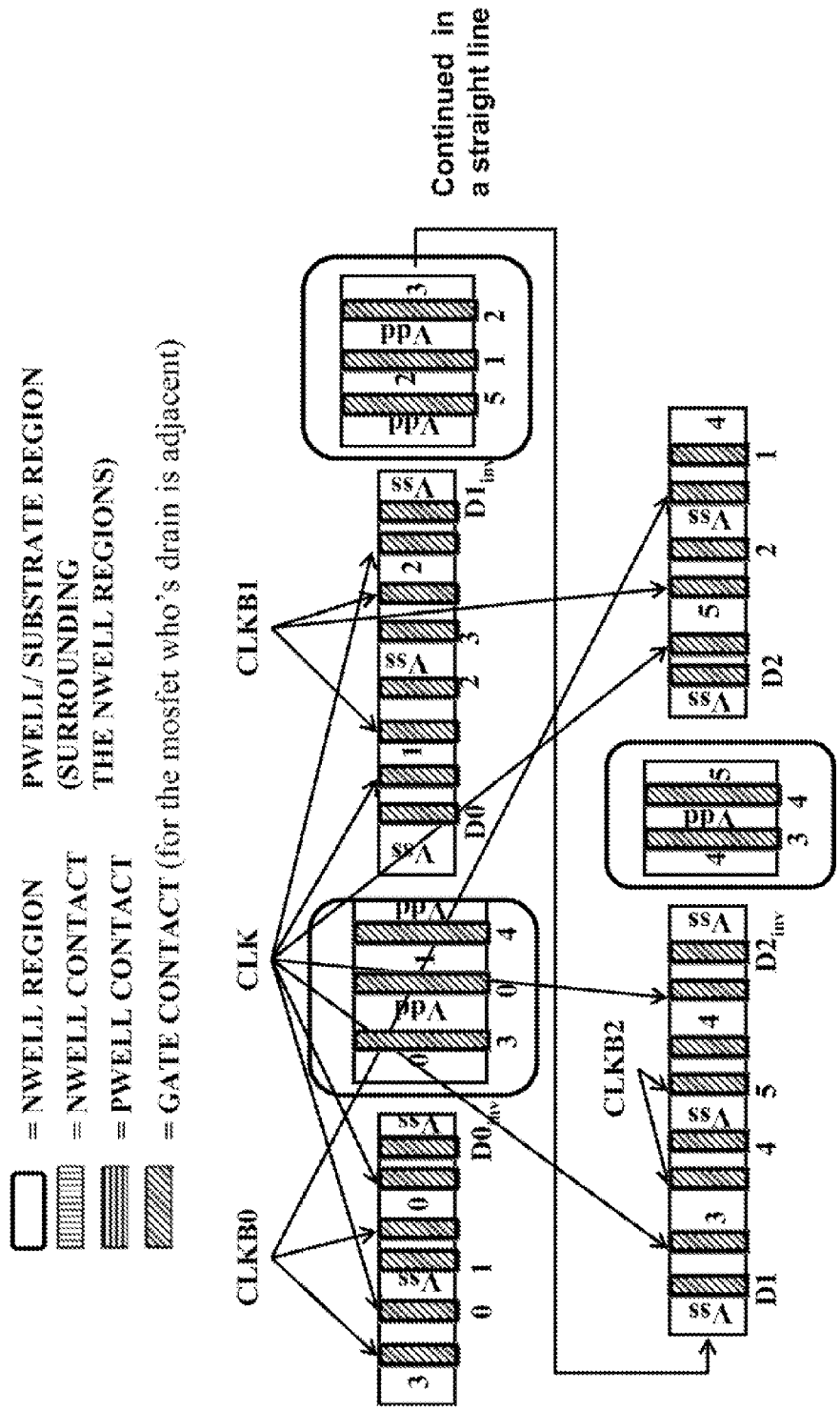
FIG. 20 is a possible arrangement of the nodes in the triple DICE voting circuit from the schematics in FIG. 19.

FIG. 19 is a Triple Dual interlocked cell (DICE) latch with voting including a first variant to introduce symmetric clocking D, and Dinv, are the data input and inverse of data input, respectively, CLK is the clock, and CLKB0, CLKB1 and CLKB2 are the inverse of the CLK, where the inverse of the CLK is here included as three separate signals CLKB0, CLKB1 and CLKB2, the claims also cover the case where CLKB0, CLKB1 and CLKB2 are the same signal (or interchanged with respect to how they are connected into the circuit). FIG. 20 is a possible arrangement of the nodes in the triple DICE voting circuit from the schematics in FIG. 19, where the nodes n0-n5 are the n-type MOSFET drains, and p0-p5 the p-type MOSFET drains, that are connected to node 0-5 respectively, and where cyclic permutation of the nodes included in the claims, as well as any position switch of any two odd p-drain, odd n-drain, even p-drain, even n-drain node pairs. FIG. 19 shows the same voter circuit, but with added MOSFETs, only of n-type, to accomplish clocking. A layout for this voting latch, generated according to the methodology in U.S. patent application Ser. No. 12/354,655, is shown in FIG. 20.

The duplicated logic discussed above is such that only one, but never both of the two signals carried by the logic can have an error at a particular time, but never both. When several of these type of duplicated logic cells are connected to form a combinational logic chain, there is a possibility that an error pulse is generated on one of the signals in a certain gate, and that an error signal is generated on the other signal (by the same single event) in another logic gate. If the connection of these two logic gates is such that these two current pulses can overlap in time, then both of the duplicated signals could be wrong and the filtering would not work. However, the nature of the layout of the duplicated logic cells described above will be such that if they are placed in a certain way relative to each other, then it can be ensured that if the single event generates an error pulse in both the cells, then it will always be on the same signal (i.e., this error will be filtered by the filtering described above).

The layout for duplicated logic gates generated using the methodology in U.S. patent application Ser. No. 12/354,655 will generally have all nodes placed along a line in the layout. A concrete example is the duplicated NAND gate discussed above. If two such cells are placed next to each other along this line in the layout, and such that the contact area(s) which are closest to the abutting edge of the two cells are such that a single event that affects these nodes generate an error pulse on the same signal, then it is ensured that there can be no single event affecting these two cells that can generate a single event on both of the two signals carried by the logic.

Figure 21:
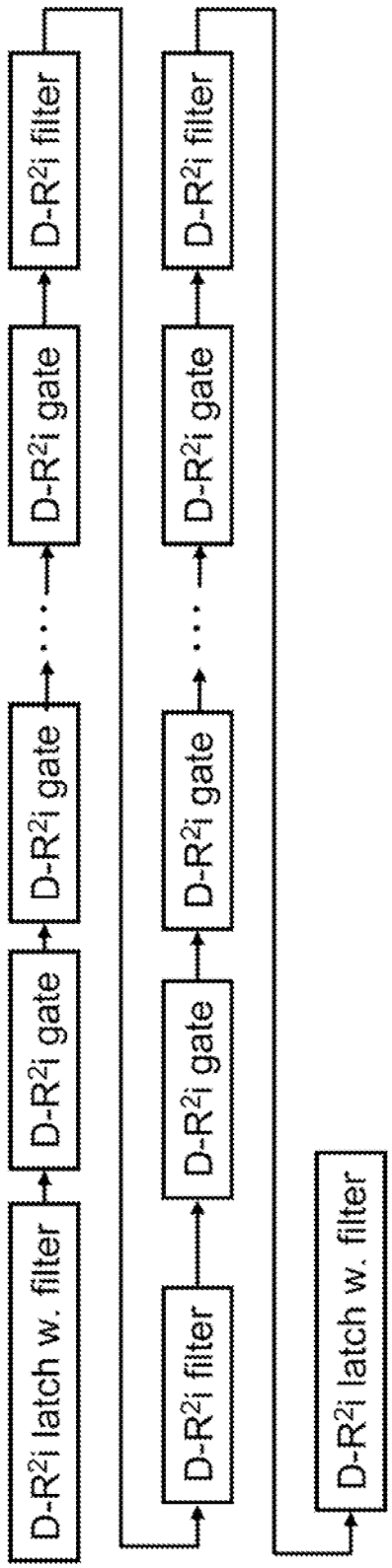
FIG. 21 is one embodiment of a layout.

FIG. 21 is one example of a layout arrangement. Combinational cells (D-R$^2$i gate) are generated using the technique from U.S. patent application Ser. No. 12/354,655. These gates are such that they individually are hard against all errors. The cells are also hard against inter-cell single-events that occur along the long direction of the cells (horizontally in the figure). Such cells occur, e.g., in a logic which uses duplicated logic carrying the man data signal and the inverse of the main data signal. However, the cells are such that inter-cell errors that affect two cells and hit the cells perpendicular to the long direction (vertically in the figure) can (depending on the implemented logic functions) generate an error in the circuit. The arrangement places as many of the combinational gates as can be allowed by general considerations (such as area routing etc.) along the direction for which no errors can be generate (neither by intra-nor by inter-cell single events), and at the end of each chain, places a filter cell which is such that is prevents inter-cell single events between cells separated by the filter, from generating overall circuit errors. The filters can be either a plain filter (D-R$^2$i filter) or a combined latch-filter (D-R$^2$i latch w. filter).

FIG. 21 is one embodiment of a layout. In one embodiment of the invention, devices a way to generate a layout for a combination of duplicated logic gates, described above, by: 1) an analysis of each pair of logic gates to determine if the logic connections permit an error pulse on one of the two signals in one gate, and on the other (inverse) signal in the other gate, to propagate and to overlap in time by the time they reach the next filtering point in the circuit; and 2) if this is the case, then the two gates are placed in the logic in a way that their relative placement and orientation is such that error pulses generated in both cells by one single event, always will be on the same signal. Typically this will cause several cells to be placed along a line in the layout (see FIG. 21). This type of placement is carried through as long as it is possible and does not cause to big problems, and the chain is always terminated by a filtering (either a filtering latch or a stand-alone filter cell, e.g., of the types discussed above). Thirdly, the logic is continued, after the filter, either following the placement strategy above (e.g., along the line) or at a point far enough from the filter (or latch), such that an error pulse generated at the output of the filter (or filtering latch) and in the following logic element, generated by the same single event, is very unlikely (due to the physical separation of these two elements). A principal such arrangement is shown in FIG. 21.

Figure 22:
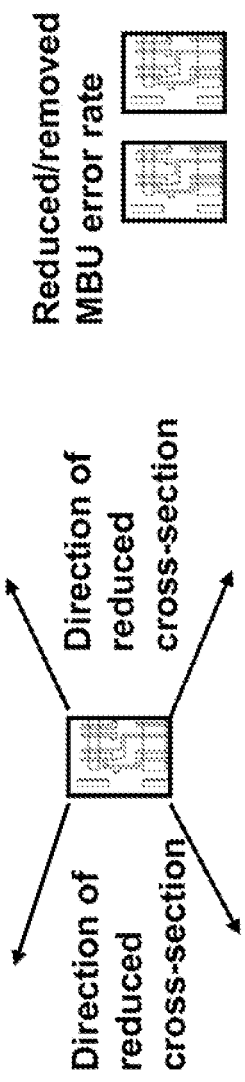
FIG. 22 illustrates how to apply the layout methodology to reduce MBU rate (but not necessarily removing single errors).

FIG. 22 illustrates how to apply the layout methodology to reduce MBU rate (but not necessarily removing single errors). In one embodiment of the invention also devises a way to apply the general layout methodology of U.S. patent application Ser. No. 12/354,655 to reduce, or prevent single event generated errors in certain combination of cell, without necessarily reducing or preventing errors in any single cell. This is accomplished by, according to the methodology in U.S. patent application Ser. No. 12/354,655, placing two contact area of a circuit cell, for which a single event has opposite effect on the state of the circuit, close to each other. This, in itself, will cause some reduction in the single event error rate of the cell. Furthermore, for single events that are in a direction that maximizes the effect on both cells (i.e. caused by charged particles traveling in a direction that passes directly through both of these contact areas, there will be a particularly strong reduction in the overall effect on the circuit caused by the single event and hence a stronger reduction in error rate for these type of events (FIG. 22).

Figure 23:
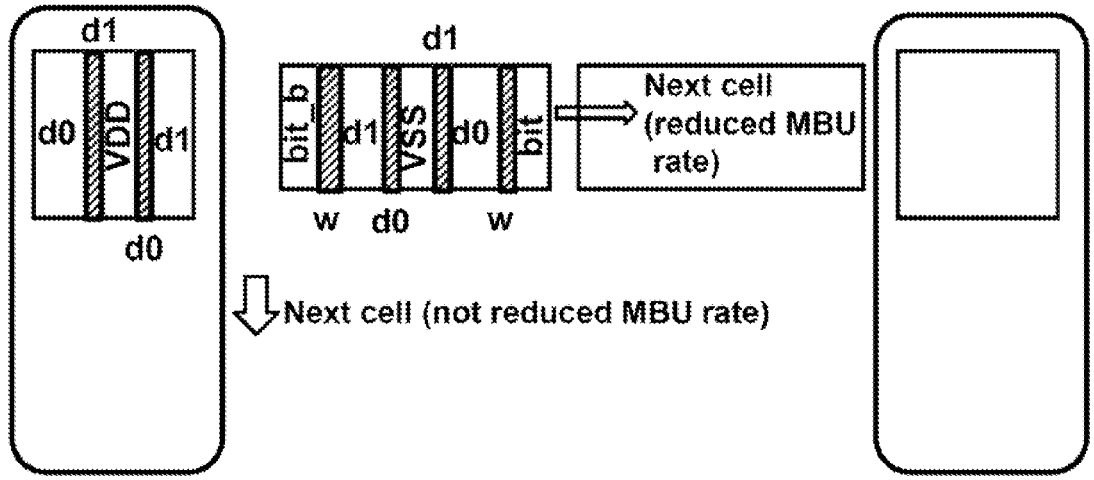
FIG. 23 is an SRAM cell laid out to have a reduced error cross-section in the horizontal direction (the direction of "Next SRAM cell (same word)"), where d0 and d1 are the stored data, w is the word line, bit, and bit_b are the bit lines.

If other cells are placed next to the first cell in the direction of reduced single event impact, and these other cells have a layout and orientation which also reduces the single event impact in the same direction as the first cell, then the effect of a single event that affect two, or more, of these cell, and hence has the direction of these cells (i.e., the direction of reduced impact, will be strongly reduced). Hence the probability to generate an error in two, or more, of these cells, by one single event, will be strongly reduced, compared to the case when the cells are placed next to each other in a direction that does not have this reduced single event impact (see FIG. 22). An example application of this inter-cell arrangement is for an SRAM cell array, e.g., see FIG. 23, which shows an SRAM cell laid out to have a reduced error cross-section in the horizontal direction (the direction of "Next SRAM cell (same word)"), where d0 and d1 are the stored data, w is the word line, bit, and bit_b are the bit lines.

Finally, a specific implementation of the method described herein is devised, whereby each, or some contact areas, are connected, via a MOSFET to another contact area of the same type which is connected to one of the power lines. For an n-type drain contact area, an n-type MOSFET is added next to said contact area, the source of which is connected to the high power (VDD), and the gate of which is always connected to the low power (VSS). While this MOSFET will always be off during regular operation, the adjacent contact area (connected to VDD) will help reduce the effect of a single event on the first contact area, by collecting some of the single event charge and by, pulling the voltage of the first contact area towards VDD (this is an advantage since for n-type drains in a CMOS technology, a single event only generates an error signal when the data value on the node connected to the contact area is high, if the data value is low, a single event will try to pull the value on the node still lower, which will not cause an error). Similarly, for a p-type drain contact area, a p-type MOSFET is added next to said contact area, the source of which is connected to the low power (VSS), and the gate of which is always connected to the high power (VDD).

Layout Methodology According to U.S. patent application Ser. No. 12/354,655

One embodiment of this invention comprises a unique new layout method, which takes advantage of the overall circuit response to a single event effect. It also includes specific circuit cells with layout, which have been constructed in accordance with the new layout method.

A radiation generated single event (soft-) error (SEE) occurs when the charge, generated in the semiconductor material by one or more (e.g. secondary) charged particles, is collected by contact areas. The contact areas are the low resistivity regions on, or in, the semiconductor substrate, which are connected to a net in the circuit, e.g., the source and drain areas in a MOSFET technology. A circuit net (or node) refers to a part of the circuit, connected by low resistivity regions (metal), which maintains a certain voltage value (referred to as the voltage state of the net) throughout its' extent. A net can be connected to any number of contact areas.

The charge collected by contact areas during a single event, leads to current pulses in the circuit, which, in their turn, cause a change in the voltage of the circuit nets, connected to these contact areas, i.e., a voltage pulse in the circuit. These pulses can upset a sequential element (latch, flip-flop) or propagate through combinational logic (i.e., a set of digital logic gates) and be latched in as errors at the next sequential element in the circuit.

The effect of a single event on the voltage on the circuit net, is different for different contact areas, e.g., a single event can have the effect of increasing the voltage on the net connected to the contact area, or decreasing it, depending on where the contact areas are located in substrate, and how they are connected to the circuit. The method in accordance with one embodiment of this invention uses an arrangement of contact areas in such a way that single event generated pulses in the circuit, that occur on multiple contact areas, acts to oppose each other, with respect to the effects they have on the voltage of the circuit nets, and hence cancel (or greatly reduce the effect of the single event).

The method also comprises an adjustment the strength of the effect a single event has on the voltage of the circuit nets, when this is desirable to achieve the desired total effect on the circuit. This adjustment can be achieved by changing the sizes of the contact areas, and by changing their positions relative to other components in the layout.

The method can be applied to sequential logic elements (latches, flip-flops, memory cells), to combinational logic (a connection of one or more digital logic gates), or to analog circuit cells.

In the following two section details of two specific ways to apply the method are described. The first, section 4.1, uses a placement, and strength adjustment, such that the single event effects, on several contact areas, cancel out each other, in terms of their effect on the circuit nets they are connected to. The second, section 4.2, uses a placement, and strength adjustment, such that two, or more, redundant nets in the circuit, are affected differently by a single event, in such a way that a single event cannot simultaneously change their voltage state on several of the redundant nets.

A. Layout Method Using Symmetric Arrangements—Method 1

The key steps in method one are:

1. Identify which contact areas have opposing effects on the circuit nets when they are simultaneously affected by a single event 2. Place these nodes in the layout next to each other, and in a fully symmetric way with respect to other adjacent contact areas a. In particular in a CMOS technology the contact are configured in a symmetric (equivalent) position with respect to well junctions and well contacts b. If the two contact areas are part of a sequential element (e.g., a latch), this arrangement ensures that these two nodes cannot be upset by a single event that affects both areas, i.e., an event which has an extended charge (e.g., as generated by a charged particle passing through) which is in such a direction that it affects both these nodes.

c. If nodes are part of a combinational element, the arrangement ensures that the generated output pulse is greatly suppressed, when the generation single event affects both nodes, i.e., an event which has an extended charge (e.g., as generated by a charged particle passing through) which is in such a direction that it affects both these nodes.

3. In an element using additional protective circuitry (redundant nets), place the contact areas of the redundant nets in a direction, which is such that when the charge from one single event effects both primary, and redundant nets, it is in the direction which is such that it always also affects both opposing nodes in either the primary or the secondary circuit, or that it affects the opposing node of both primary and secondary circuit.

Specifically for CMOS technology, step one and two above would use the following to characterize the effect of a single event on a source or drain contact area:

a. When an n-drain (or source) is affected by a single event, the effect of the single event is to reduce the voltage on the net connected to this contact area, i.e., if the node is high is will tend to switch the voltage, when the node is low, it will not tend to switch the voltage.

b. When an n-drain (or source) is affected by a single event, the effect of the single event is to reduce the voltage on the net connected to this contact area, i.e., if the node is high is will tend to switch the voltage, when the node is low, it will not tend to switch the voltage.

Also, specifically for a CMOS technology, step 3 above, would use the following rules for two nodes, each connected to a net carrying redundant signals (primary and secondary nets):

a. When two n-drains (or sources), one connected to the primary net and one to the secondary net, are affected by a single event, and they always have opposite voltage states, then only one of the primary/secondary nets can be upset (i.e., change its' voltage).

b. When two p-drains (or sources), one connected to the primary and one to the secondary net, are affected by a single event, and they always have opposite voltage states, then only one of the primary/secondary circuits can be upset.

c. When an n-drain (or source) from one net, and a p-drain (or source) from the other net is affected, are affected by a single event, and the nets connected to these drains (sources) always have the same voltage state, then only one of the primary/secondary nets can be upset.

B. Layout Method Using Asymmetric Arrangements—Method 2

For the case of an element that uses primary and redundant nets to store the state (i.e., the voltage or signal), an alternative to synthesizing a layout where single event effects cancel out each other, is to deliberately let one of the contact areas be stronger with respect to single event charge collection. This contact area will then always determine the outcome of a single event in on the connected net (e.g., for a p-drain it would always end up HIGH (at Vdd)). When there are four nets that store the state (2 primary nets, two redundant nets), and we make sure that net connected to the contact areas that is made dominant in the primary circuit part, stores the opposite state to the net connected to the contact area that is made dominant in the redundant circuit part, then only one of the two redundant circuit parts can be upset by an event that affects both circuit parts. Using this variant, the robust cell synthesis methodology would be as follows:

For designs that use primary and redundant nets to store a state:

a. Identify which contact areas have opposing circuit effects when they are simultaneously affected by a single event (in the primary as well as the redundant part)

b. Place these nodes in the layout next to each other, and make one of the nodes dominant with respect to a single event (e.g., by making the drain area larger, and changing the distance to the well-junction and the well-ties).

c. Make sure that the net connected to the dominant contact area of the primary circuit part, stores the opposite state to the net connected to the dominant contact area in the redundant circuit part.

d. Place the primary and redundant contact areas, relative to each other, in such a way that a single event the affects both the primary and redundant circuitry, also always affects both the dominant and the non-dominant nodes in the primary and in the redundant part.

(i) In this way, either the primary or the redundant part will be in a state where the dominant node will make sure this circuit part cannot be upset (i.e. change its state or voltage). Hence, in any situation only ONE of the redundant parts can be upset by a single event.

C. Discussion, Clarification, and Specific Circuit Cells

Figure 24:
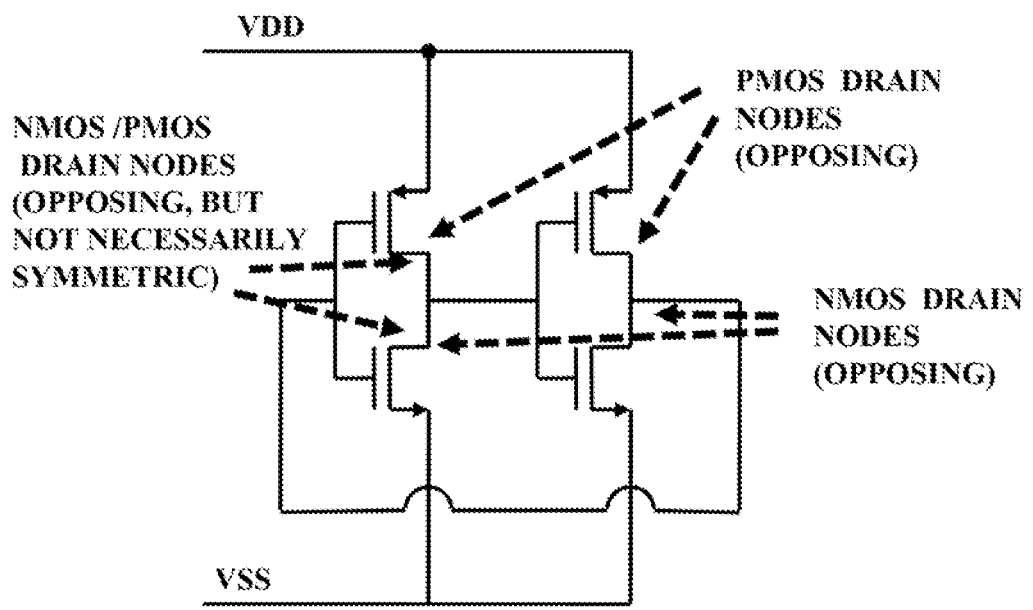
FIG. 24 illustrates primary opposing nodes in a latch cell.

In a basic sequential logic circuit element (latch, sram-type memory cell, etc.) there are two main nets that maintain the state. These will always have opposite state (voltage). FIG. 24 illustrates primary opposing nodes in a latch cell. FIG. 24 shows the schematics of the fundamental components of a latch circuit implemented in a CMOS technology. In this latch, each of the two (main) net is connected to two contacts areas in the layout (the nmos device drain and the pmos drain).

Figure 25:
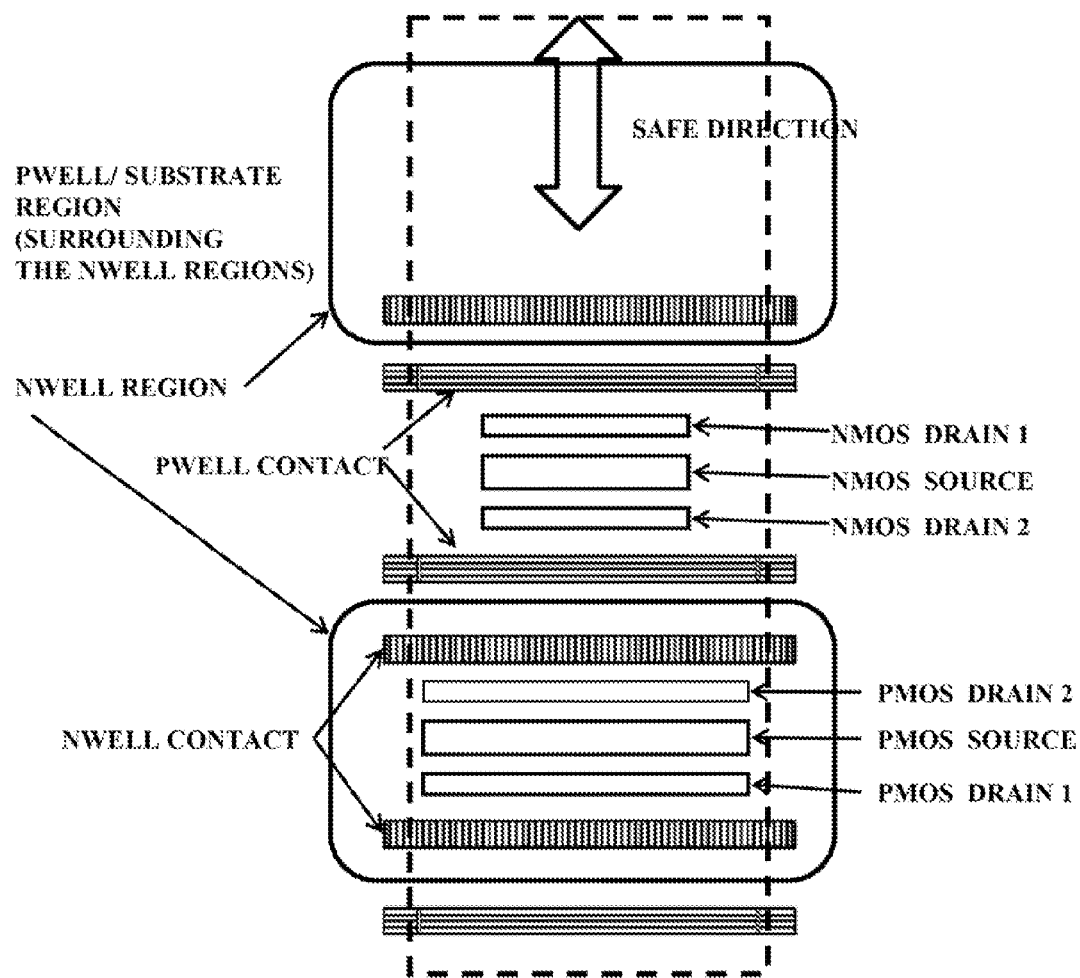
FIG. 25 illustrates an arrangement of opposing node of a latch circuit.

In this configuration the contact areas that will have opposing effects with respect to the state of the latch, when affected by the same single event, can be identified as (step 1 above):

a. A single event that affects both pmos drains will have opposing effects on the state of the latch b. A single event that affects both nmos drains will have opposing effect on the state of the latch c. A single event that affects both nmos and pmos drain of the same node will have opposing effect on the state of the latch In the symmetric method, we arrange the layout such that drains, with opposing effects, are placed next to each other, in a symmetric arrangement (i.e., with respect to symmetric with respect to the surrounding layout, and having the same shape). This is step 2 in the methodology number 1 above. FIG. 25 illustrates an arrangement of opposing node of a latch circuit. FIG. 25 shows such an arrangement where we have utilized the first two of the opposing contact area identifications above. We now have a latch which cannot be upset if the single event has such a directions that is passes the two nets of the circuit.

Step 3 in methodology number 1, as well as method number 2, concerns the case when an additional (redundant) circuit (here a latch) is available. In a circuit configuration that uses two latches to maintain the states, there will be 4 main nodes, n1, n2, from the primary latch, and n3, n4, from the secondary latch. The nodes from one latch will be in opposite states, and, during correct circuit operation, each node in the primary latch will always have the same state as one node in the secondary latch. This situation is shown in TABLE 1, where n1 and n3 maintain the same state, and n2 and n4 maintain the same state.

Figure 26:
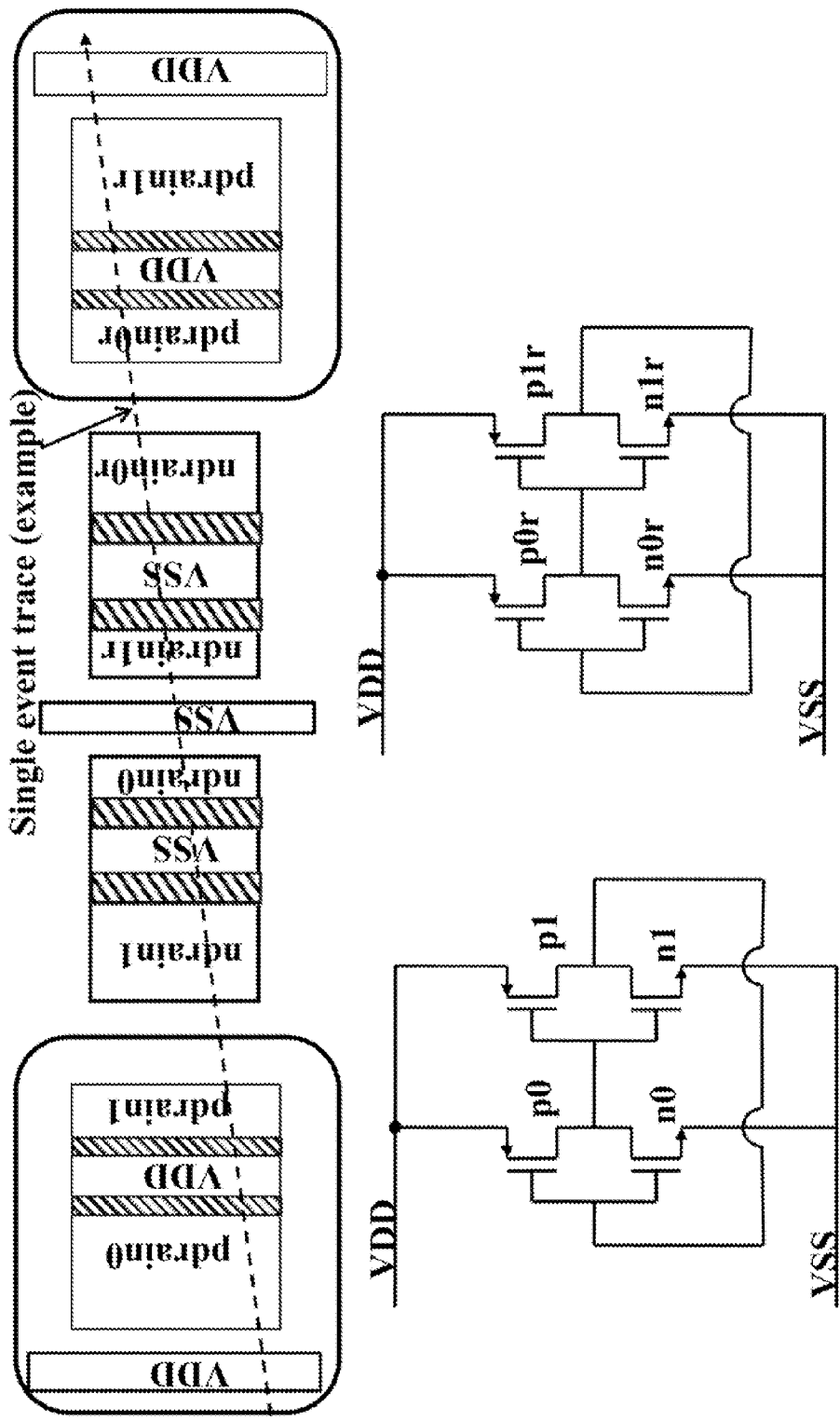
FIG. 26 is a circuit schematic and layout for duplicated latch cells (e.g., for BISER).

According to step 3, the nodes of the second latch are now placed, with respect to with respect to the first latch, such that when an extended event occurs that affects both latches, it will be in a direction which affects both opposing nodes in each individual latch, or at least in one of them. FIG. 26 shows such an arrangement, where the method with dominating nodes (methodology 2 above) has been used, and the two latches have been placed in such a way relative to each other that at the most, one of the latches can be upset, by any single event, but not both. FIG. 26 is a circuit schematic and layout for duplicated latch cells (e.g., for BISER). using placement and sizing to ensure complete hardness against single and multiple node single event effects, where for a single event affecting several nodes, the primary latch can only be upset when node 1 is HIGH, and the redundant latch can only be upset when node 1 (r) is LOW, hence, any single event that affects both latches, can only upset one of the two latches in the BISER configuration, and therefore, cannot generate an error.

The same situation is the same also for other sequential elements (e.g., memory cells) and the method applies to these elements as well. The method also applies to elements which uses more than 2 nodes to maintain the state, as well as non-sequential elements with a primary and secondary redundant net.

TABLE 1

The state for the nodes in a circuit that uses a primary (nodes, n1, n2) and secondary (nodes n3, n4) circuit for storage or processing of the state.

| | Node: | | | |
|---|---|---|---|---|
| | n1 | n2 | n3 | n4 |
| State: 0 | 0 | 1 | 0 | 1 |
| State: 1 | 1 | 0 | 1 | 0 |

To extract the correct signal from the two, or more, redundant nets, a filtering, or voting circuit is used. The filtering ensuring that at any time where one of the redundant nets is wrong (e.g., for the redundant nets carrying the same voltage state; if the voltage states differ) the signal is not allowed to pass through the filtering circuit. The Built-In Soft Error (BISER) design [Mitra2005] is an example of such a configuration. A voting circuit, being used on at least 3 redundant circuit, performs a vote between the voltage states of the redundant nets. Triple mode redundancy (TMR) configurations use this type of redundancy.

One embodiment of this invention also comprises several specific DICE cells, created using the layout method. The DICE (Dual Interlocked Cell) latch [Nic2005], the circuit of which is shown in drawing 3, also uses four nets to store the circuit state, but as can be seen in drawing 3, they are not connected as two separate latches, but in an interlocked way.

The principal arrangement of the 4 storage nets, of the DICE cells in one embodiment of this invention, is that the contact areas of the nets are placed along one direction (e.g., drawing 4), and that they have a certain order, than minimizes or removes the effect of the single event, and hence reduces or removes the possibility that the storage element can be upset by a single event. The first variant (variant 1) is shown in drawing 4. In this variant the MOSFET pairs have been placed in the same active area with a common MOSFET source contact in-between. However, they can also be placed in separate active areas, using separate sources contacts, and they can also be oriented so that the sources are perpendicular to the direction of the drain nodes.

Figure 27:
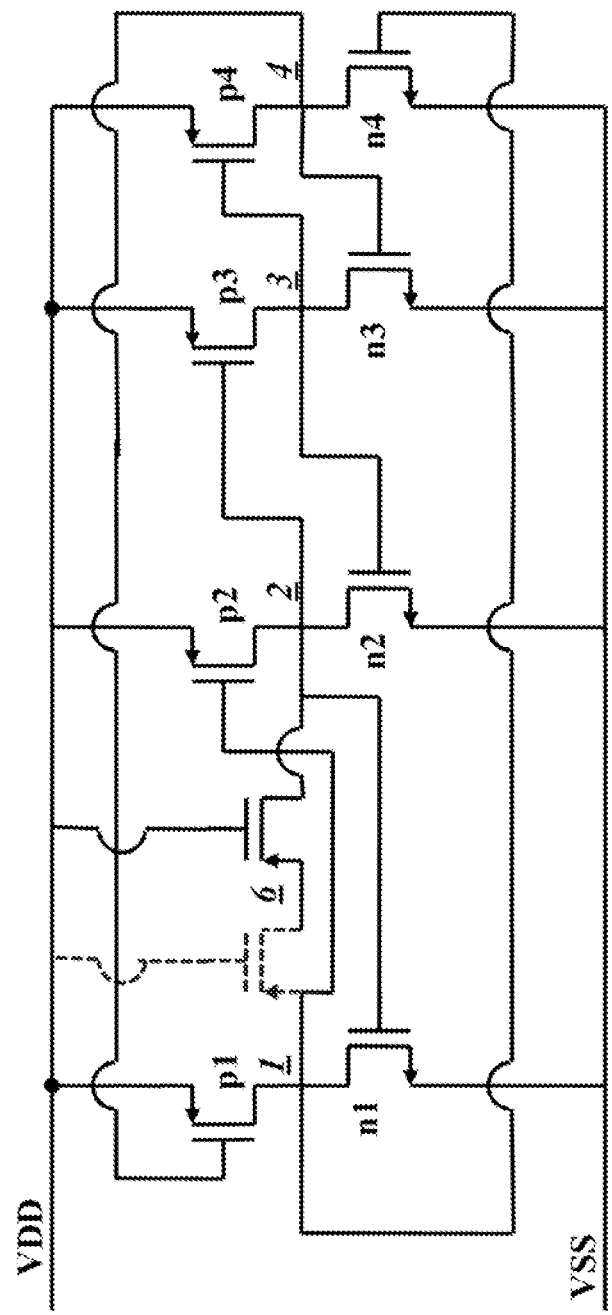
FIG. 27 is a net-list corresponding to the second preferred arrangement.

FIG. 27 is a net-list corresponding to the second preferred arrangement, where the yellow MOSFET may or may not be included, as long as node 6 is connected to drain 6a in FIG. 27, and p1 and 6a are physically separate.

Figure 28:
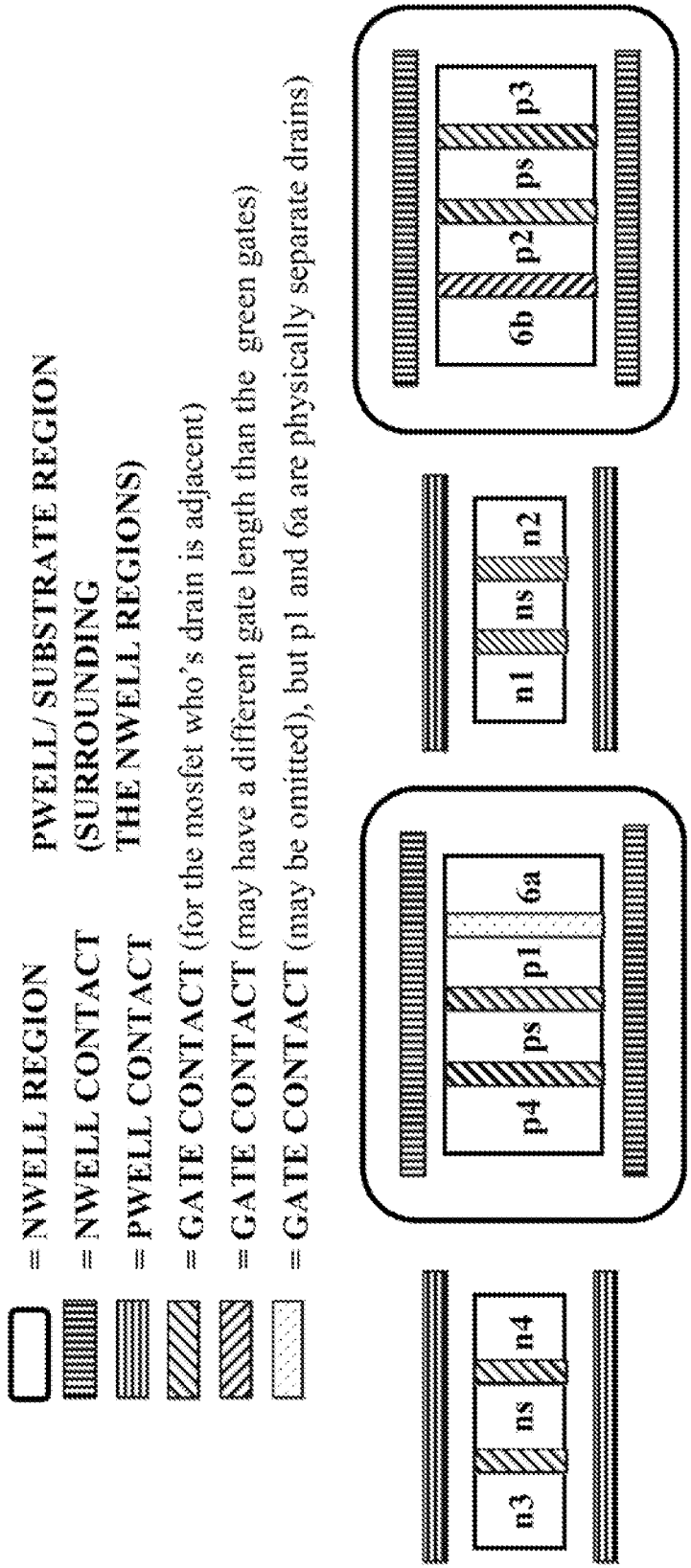
FIG. 28 is a second preferred layout arrangement.

FIG. 28 is a second preferred layout arrangement, where ns/ps are the source contacts for the two MOSFETs whose drains are adjacent, node 6a and 6b are connected, where the yellow gate adjacent to node 6a may or may not be included (both variants included in the claims), but p1 and 6a are physically separate, and where the layout derives from the layout in FIG. 24, and the same variants with respect to node permutations, active, source, and well contact arrangements apply.

Figure 29:
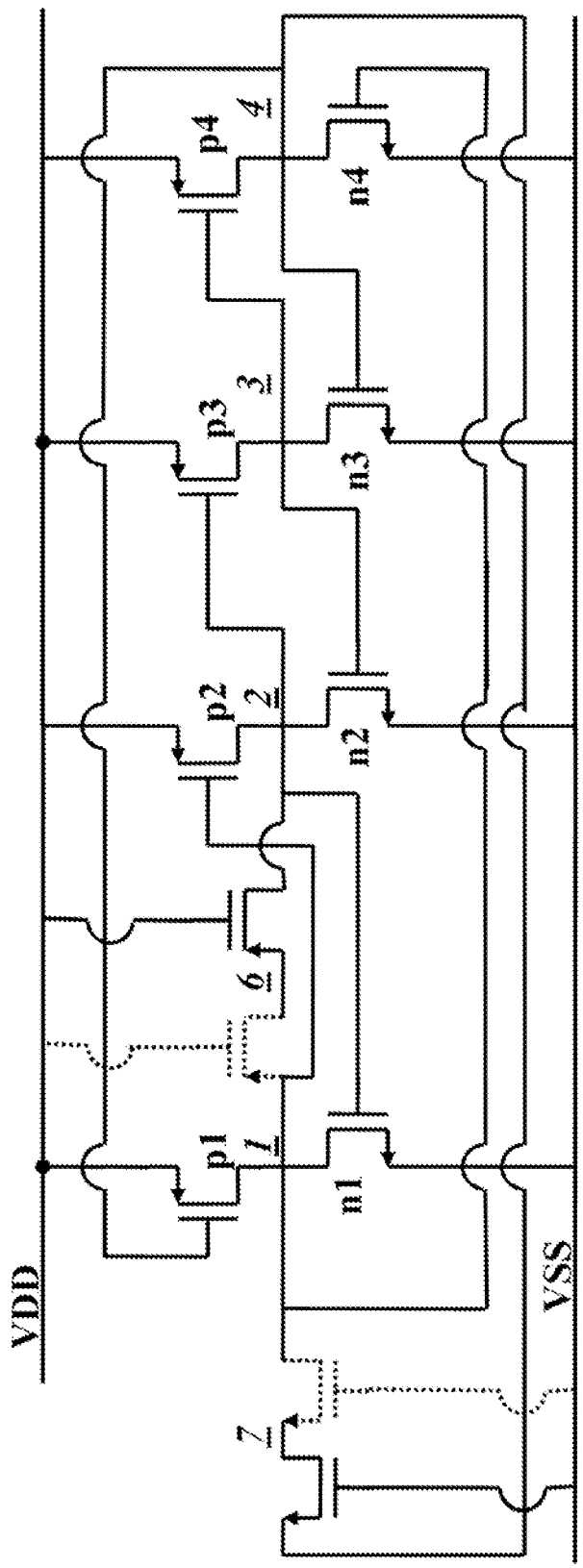
FIG. 29 is a net-list corresponding to the third preferred arrangement.

FIG. 29 is a net-list corresponding to the third preferred arrangement.

Figure 30:
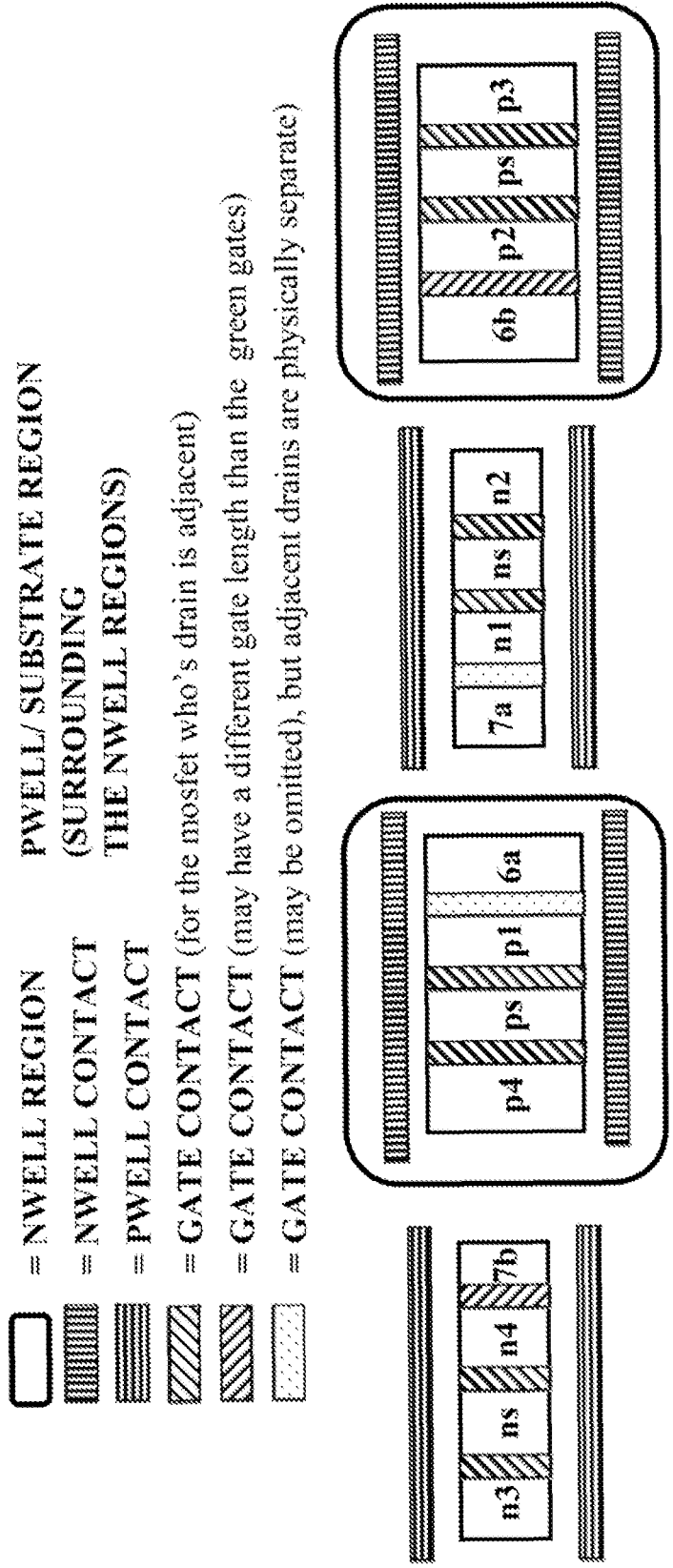
FIG. 30 is a third preferred layout arrangement.

FIG. 30 is a third preferred layout arrangement, where ns/ps are the source contacts for the two MOSFETs whose drains are adjacent, node 6a-6b are connected, as are node 7a/7b, where the gate adjacent to node 6a and 7a may or may not be included (both variants included in the claims), but the adjacent drain areas are physically separate, and where the layout derives from the layout in FIG. 24, and the same variants with respect to node permutations, active, source, and well contact arrangements apply.

Figure 31:
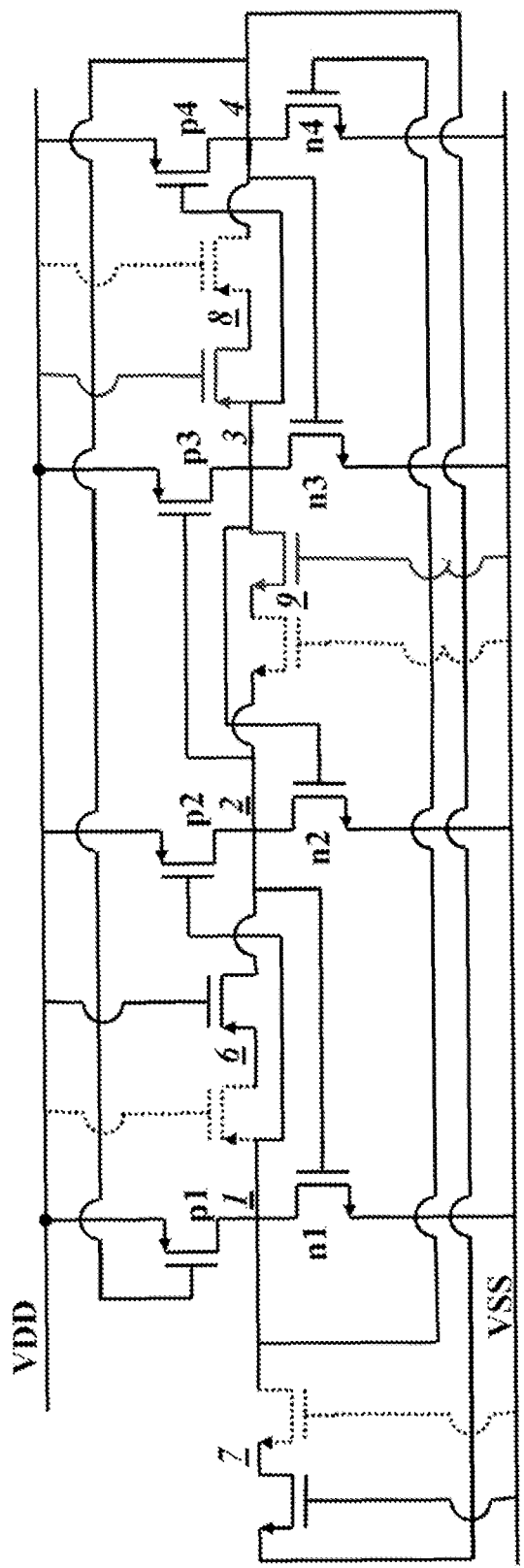
FIG. 31 is a net-list corresponding to the fourth preferred arrangement.

FIG. 31 is a net-list corresponding to the fourth preferred arrangement, the MOSFET may or may not be included, as long as node 6 is connected to drain 6a, 7 to 7a, 8 to 8a, and 9 to 9a in FIGS. 30, and 6a, 7a, 8a, 9a are physically separate from their adjacent main drain node.

Figure 32:
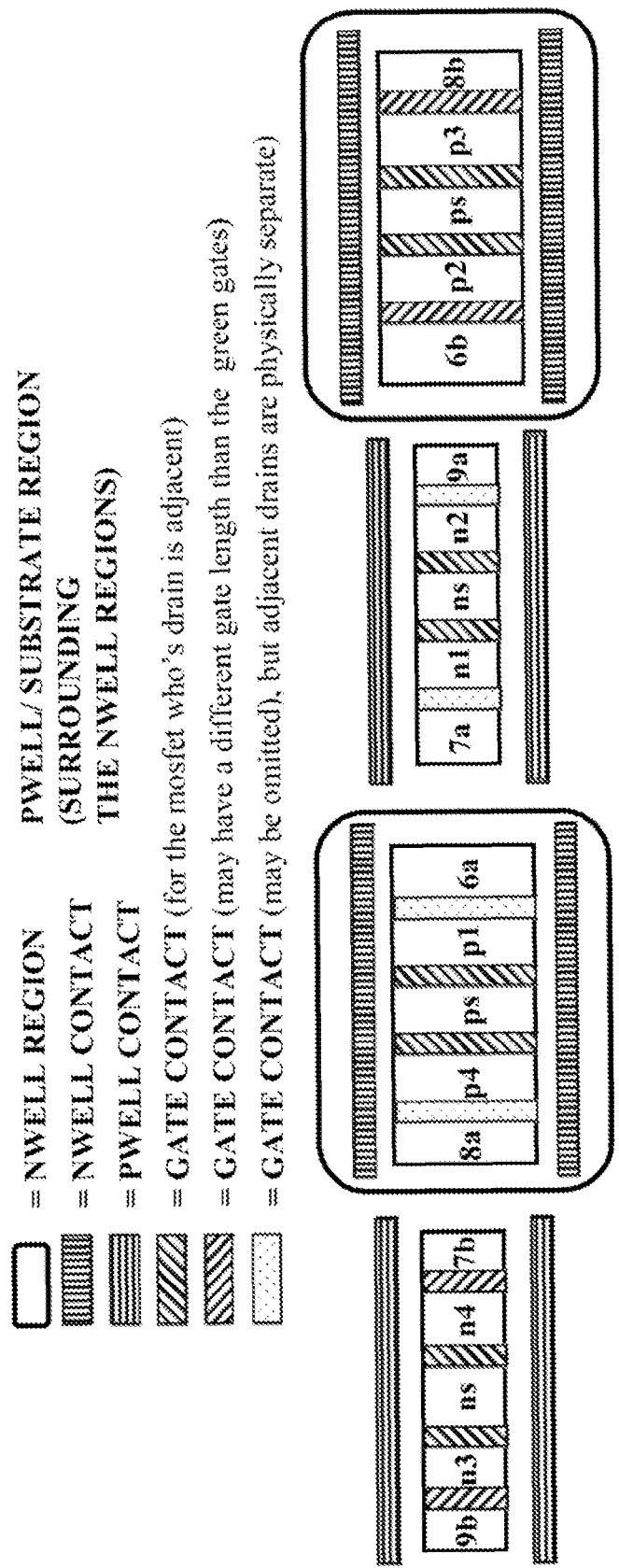
FIG. 32 is a fourth preferred layout arrangement.

FIG. 32 is a fourth preferred layout arrangement, where ns/ps are the source contacts for the two MOSFETs whose drains are adjacent, where node 6a/6b, 7a/7b, 8a/8b, and 9a/9b are connected, the gates adjacent to nodes 6a, 7a, 8a, 9a may or may not be included (both variants included in the claims), but nodes 6a, 7a, 8a, 9a are physically separate from their adjacent MOSFET drains, where the layout derives from the layout in FIG. 24, and the same variants with respect to node permutations, active, source, and well contact arrangements apply, and where the claims also cover the various additional variants where and combination of the extra nodes 6a/6b, 7a/7b, 8a/8b, 9a/9b have been included or omitted.

In variants 2-4 (FIGS. 27-32) protective nodes have been added. They act to protect certain sensitive node-pairs and are not (necessarily) active during normal circuit operation. However, they can also be used as active devices connecting their gates to other storage nodes. For example, while variant 1 is much more robust than the normal layout (which does not have other nodes in between the sensitive node pairs), there are still some single event sensitivity remaining, the main being for the node pair p1-n2. By extending variant one as shown in drawings 5-6, the node pair p1-n2 is also protected. This is variant 2. The most sensitive node pair in variant 2 is the n1-p4 node pair, this pair is protected with the extension in variant 3 (FIGS. 29-30). Finally the latch can be made symmetric by adding additional protective nodes. A fully symmetric arrangement of protective nodes is shown in FIGS. 31-32 (third variant).

The addition of additional protective MOSFETs has a general application to circuits which uses redundant nets. In the same way as in the case of the DICE circuit, they can be used to keep the state of a circuit node which becomes floating (not connected to the power, i.e., to VSS or VDD) during a single event. Floating nets become very sensitive to the single event charge, their voltage state can change very easily (i.e., even by very weak interaction with the single event). The additional protective devices, even if they just turn on partially during the single event, will make the nodes, that become floating during a single event, much more stable.

Figure 33:
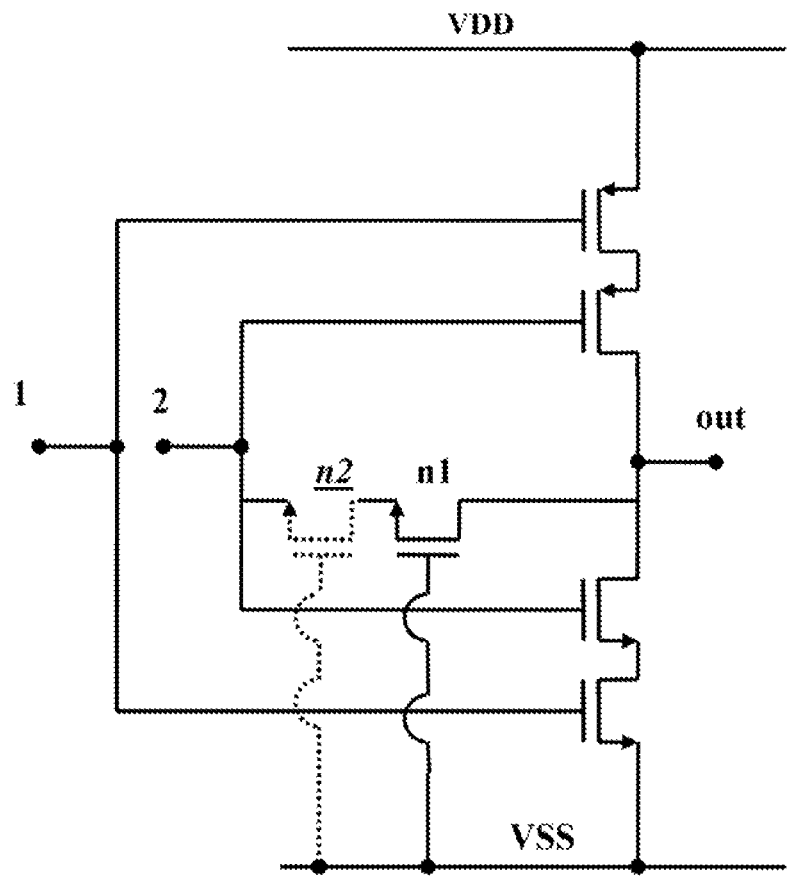
FIG. 33 is one example of adding protective MOSFET devices to a c-element filter circuit.

Another (not DICE) example of the addition of such protective devices for a c-element filtering circuit is shown in FIG. 33, which is one example of adding protective MOSFET devices to a c-element filter circuit. The ndrain of the output of the c-element (i.e., a net which becomes floating if the two inputs have different voltage states) is connected, via the protection MOSFET n1, either to an n-type contact area close to the ndrain of the input net 2, or via a second protective MOSFET, n2, to the ndrain of the input net 2, and where this protection would be adequate when the layout is such that the ndrain of the c-element output and the ndrain of the input node 2 are the most sensitive contact area pair (i.e., that other mutually sensitive contact areas are further apart, and/or have other opposing contact areas in between them), and as in the case of the DICE circuit more protective MOSFET devices can be added to protect other mutually sensitive contact area pair, if required.

In one embodiment, the invention also comprises a combinational circuit where all, or some of the nets have been duplicated, in such a way that there is one (primary) net that carries the signal, and a second (redundant) net carries the inverse of the signal on the primary net (i.e., when the voltage on the primary net is high, the voltage on the redundant net is always low, and vice versa), and where, in accordance with the layout method, the contact areas of the primary and redundant net, are placed in such a way that when a single event affects both nets, a voltage pulse can only be generated on one of the nets, but not on both. For this type of duplicated combinational circuit, a filtering also needs to be applied to the outputs (at some point before the signal is latched into a single sequential element), which prevents propagation of a signal, unless both nets have their correct state (i.e., one being the inverse of the other). Alternatively sequential elements can also be duplicated, and an error detection and correction added at some point in the circuit (an error being identified by comparing the signal on the two redundant nets).

Figure 34:
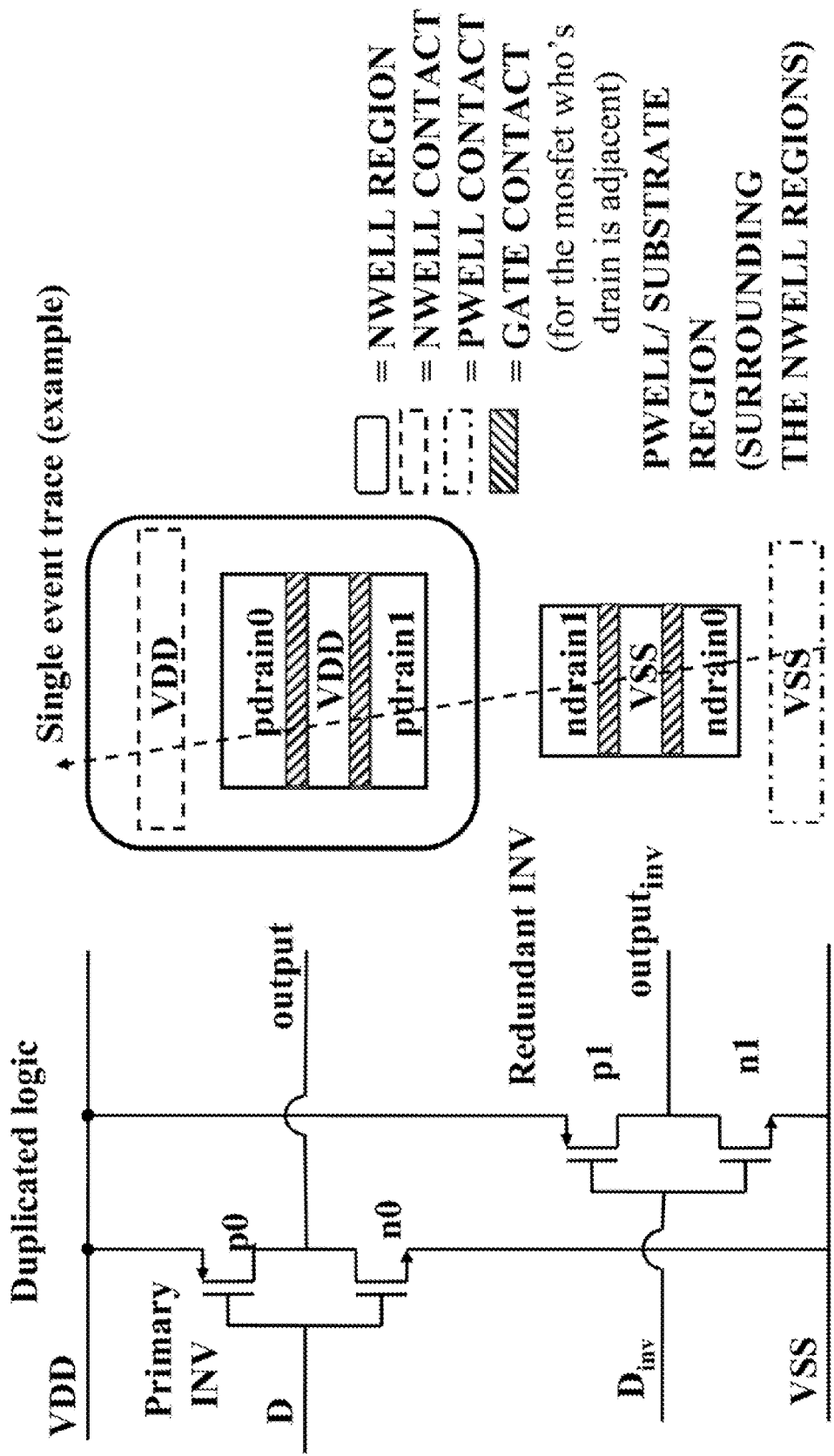
FIG. 34 is an example of a duplicated circuit.

This type of duplicated combinational circuit is shown in FIG. 34, which is an example of a duplicated circuit. In a duplicated inverter where the redundant and primary nodes carry opposite states, error signals on both primary and redundant nodes can be generated if both ndrain0 and pdrain1 are affected (if D is high) or if both ndrain1 and pdrain0 are affected (D low). By placing the nodes such, that if a particle trace goes through two nodes that can cause an error transient on both primary and redundant output, then the trace also passes through the other nodes and the pulse on one of the nets are suppressed. For example, consider the trace in the Figure; if node 0 is high, the charge collected on ndrain0 will pull node 0 low (error transient), the charge collected on node pdrain1 will pull node 1 high, however, the charge collected on node ndrain1 will pull node 1 low, opposing the effect on pdrain1, and keeping node 1 low (i.e., preventing the transient on node 1). If node 0 is low, the charge collected on node ndrain1, will pull node 1 low (error transient), however, the charge collected at ndrain0, will keep node 0 low (i.e., preventing a transient on node 0). If should be pointed out that in the general case there will be some pulses on all nodes, but that it will always hold true that a full swing pulse (a transient that can propagate) only can be generated on one, and one only, of the duplicated nodes.

Figure 35:
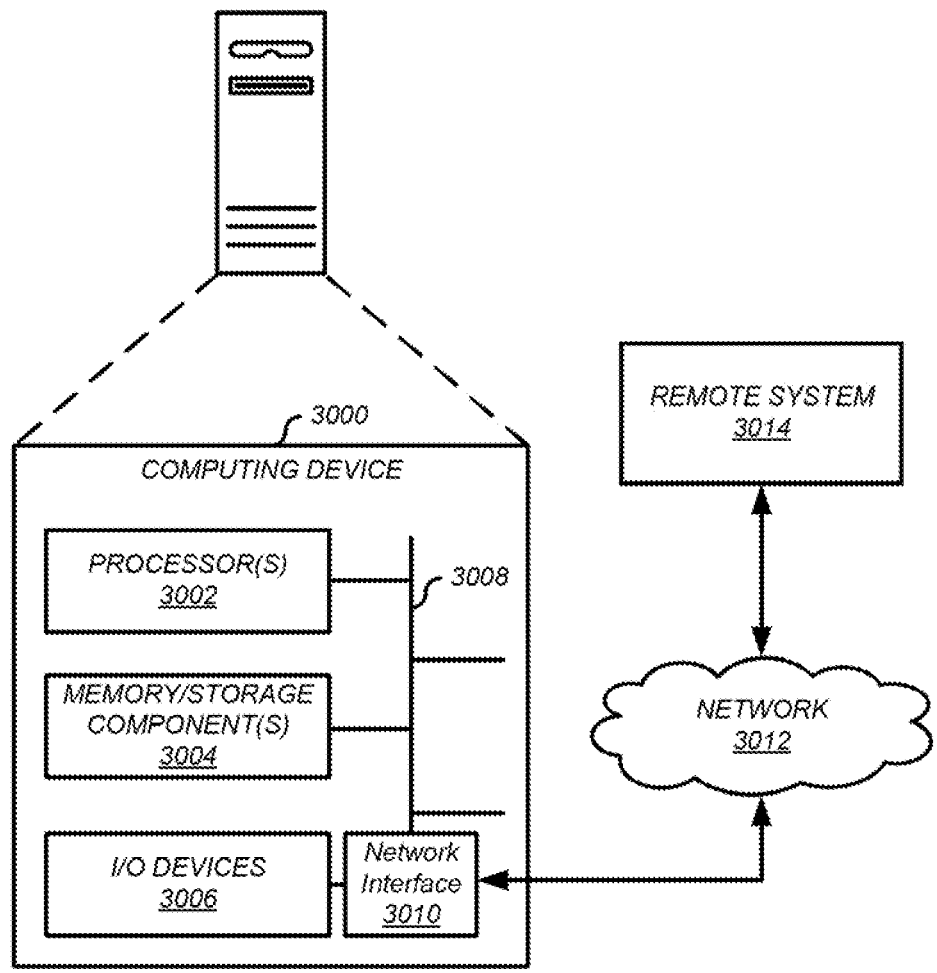
FIG. 35 shows one embodiment of a computing device which can be used in one embodiment of systems and computer-implemented methods for creating a physical layout for a logic integrated circuit cell.

FIG. 35 shows one embodiment of a computing device 3000 which can be used in one embodiment of systems and computer-implemented methods for creating a physical layout for a logic integrated circuit cell. For the sake of clarity, the computing device 3000 is shown and described here in the context of a single computing device. It is to be appreciated and understood, however, that any number of suitably configured computing devices can be used to implement any of the described embodiments. For example, in at least some implementation, multiple communicatively linked computing devices are used. One or more of these devices can be communicatively linked in any suitable way such as via one or more networks (LANs), one or more wide area networks (WANs) or any combination thereof.

In this example, the computing device 3000 comprises one or more processor circuits or processing units 3002, on or more memory circuits and/or storage circuit component(s) 3004 and one or more input/output (I/O) circuit devices 3006. Additionally, the computing device 3000 comprises a bus 3008 that allows the various circuit components and devices to communicate with one another. The bus 3008 represents one or more of any of several types of bus structures, including a memory bus or local bus using any of a variety of bus architectures. The bus 3008 may comprise wired and/or wireless buses.

The processing unit 3002 may be responsible for executing various software programs such as system programs, applications programs, and/or module to provide computing and processing operations for the computing device 3000. The processing unit 3002 may be responsible for performing various voice and data communications operations for the computing device 3000 such as transmitting and receiving voice and data information over one or more wired or wireless communication channels. Although the processing unit 3002 of the computing device 3000 includes single processor architecture as shown, it may be appreciated that the computing device 3000 may use any suitable processor architecture and/ or any suitable number of processors in accordance with the described embodiments. In one embodiment, the processing unit 3000 may be implemented using a single integrated processor.

The processing unit 3002 may be implemented as a host central processing unit (CPU) using any suitable processor circuit or logic device (circuit), such as a as a general purpose processor. The processing unit 3002 also may be implemented as a chip multiprocessor (CMP), dedicated processor, embedded processor, media processor, input/output (I/O) processor, co-processor, microprocessor, controller, microcontroller, application specific integrated circuit (ASIC), field programmable gate array (FPGA), programmable logic device (PLD), or other processing device in accordance with the described embodiments.

As shown, the processing unit 3002 may be coupled to the memory and/or storage component(s) 3004 through the bus 3008. The memory bus 3008 may comprise any suitable interface and/or bus architecture for allowing the processing unit 3002 to access the memory and/or storage component(s) 3004. Although the memory and/or storage component(s) 3004 may be shown as being separate from the processing unit 3002 for purposes of illustration, it is worthy to note that in various embodiments some portion or the entire memory and/or storage component(s) 3004 may be included on the same integrated circuit as the processing unit 3002. Alternatively, some portion or the entire memory and/or storage component(s) 3004 may be disposed on an integrated circuit or other medium (e.g., hard disk drive) external to the integrated circuit of the processing unit 3002. In various embodiments, the computing device 3000 may comprise an expansion slot to support a multimedia and/or memory card, for example.

The memory and/or storage component(s) 3004 represent one or more computer-readable media. The memory and/or storage component(s) 3004 may be implemented using any computer-readable media capable of storing data such as volatile or non-volatile memory, removable or non-removable memory, erasable or non-erasable memory, writeable or re-writeable memory, and so forth. The memory and/or storage component(s) 3004 may comprise volatile media (e.g., random access memory (RAM)) and/or nonvolatile media (e.g., read only memory (ROM), Flash memory, optical disks, magnetic disks and the like). The memory and/or storage component(s) 3004 may comprise fixed media (e.g., RAM, ROM, a fixed hard drive, etc.) as well as removable media (e.g., a Flash memory drive, a removable hard drive, an optical disk, etc.). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

The one or more I/O devices 3006 allow a user to enter commands and information to the computing device 3000, and also allow information to be presented to the user and/or other components or devices. Examples of input devices include a keyboard, a cursor control device (e.g., a mouse), a microphone, a scanner and the like. Examples of output devices include a display device (e.g., a monitor or projector, speakers, a printer, a network card, etc.). The computing device 3000 may comprise an alphanumeric keypad coupled to the processing unit 3002. The keypad may comprise, for example, a QWERTY key layout and an integrated number dial pad. The computing device 3000 may comprise a display coupled to the processing unit 3002. The display may comprise any suitable visual interface for displaying content to a user of the computing device 2000. In one embodiment, for example, the display may be implemented by a liquid crystal display (LCD) such as a touch-sensitive color (e.g., 76-bit color) thin-film transistor (TFT) LCD screen. The touch-sensitive LCD may be used with a stylus and/or a handwriting recognizer program.

The processing unit 3002 may be arranged to provide processing or computing resources to the computing device 3000. For example, the processing unit 3002 may be responsible for executing various software programs including system programs such as operating system (OS) and application programs. System programs generally may assist in the running of the computing device 3000 and may be directly responsible for controlling, integrating, and managing the individual hardware components of the computer system. The OS may be implemented, for example, as a Microsoft® Windows OS, Symbian OS™, Embedix OS, Linux OS, Binary Run-time Environment for Wireless (BREW) OS, JavaOS, Android OS, Apple OS or other suitable OS in accordance with the described embodiments. The computing device 3000 may comprise other system programs such as device drivers, programming tools, utility programs, software libraries, application programming interfaces (APIs), and so forth.

The computer 3000 also includes a network interface 3010 coupled to the bus 3008. The network interface 3010 provides a two-way data communication coupling to a local network 3012. For example, the network interface 3010 may be a digital subscriber line (DSL) modem, satellite dish, an integrated services digital network (ISDN) card or other data communication connection to a corresponding type of telephone line. As another example, the communication interface 3010 may be a local area network (LAN) card effecting a data communication connection to a compatible LAN. Wireless communication means such as internal or external wireless modems may also be implemented.

In any such implementation, the network interface 3010 sends and receives electrical, electromagnetic or optical signals that carry digital data streams representing various types of information, such as the selection of goods to be purchased, the information for payment of the purchase, or the address for delivery of the goods. The network interface 3010 typically provides data communication through one or more networks to other data devices. For example, the network interface 3010 may effect a connection through the local network to an Internet Host Provider (ISP) or to data equipment operated by an ISP. The ISP in turn provides data communication services through the internet (or other packet-based wide area network). The local network and the internet both use electrical, electromagnetic or optical signals that carry digital data streams. The signals through the various networks and the signals on the network interface 3010, which carry the digital data to and from the computer system 200, are exemplary forms of carrier waves transporting the information.

The computer 3000 can send messages and receive data, including program code, through the network(s) and the network interface 3010. In the Internet example, a server might transmit a requested code for an application program through the internet, the ISP, the local network (the network 3012) and the network interface 3010. In accordance with the invention, one such downloaded application provides for the identification and analysis of a prospect pool and analysis of marketing metrics. The received code may be executed by processor 3004 as it is received, and/or stored in storage device 3010, or other non-volatile storage for later execution. In this manner, computer 3000 may obtain application code in the form of a carrier wave.

Various embodiments may be described herein in the general context of computer executable instructions, such as software, program modules, and/or engines being executed by a computer. Generally, software, program modules, and/or engines include any software element arranged to perform particular operations or implement particular abstract data types. Software, program modules, and/or engines can include routines, programs, objects, components, data structures and the like that perform particular tasks or implement particular abstract data types. An implementation of the software, program modules, and/or engines components and techniques may be stored on and/or transmitted across some form of computer-readable media. In this regard, computer-readable media can be any available medium or media useable to store information and accessible by a computing device. Some embodiments also may be practiced in distributed computing environments where operations are performed by one or more remote processing devices that are linked through a communications network. In a distributed computing environment, software, program modules, and/or engines may be located in both local and remote computer storage media including memory storage devices.

Although some embodiments may be illustrated and described as comprising functional components, software, engines, and/or modules performing various operations, it can be appreciated that such components or modules may be implemented by one or more hardware components, software components, and/or combination thereof. The functional components, software, engines, and/or modules may be implemented, for example, by logic (e.g., instructions, data, and/or code) to be executed by a logic device (e.g., processor). Such logic may be stored internally or externally to a logic device on one or more types of computer-readable storage media. In other embodiments, the functional components such as software, engines, and/or modules may be implemented by hardware elements that may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Examples of software, engines, and/or modules may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

In some cases, various embodiments may be implemented as an article of manufacture. The article of manufacture may include a computer readable storage medium arranged to store logic, instructions and/or data for performing various operations of one or more embodiments. In various embodiments, for example, the article of manufacture may comprise a magnetic disk, optical disk, flash memory or firmware containing computer program instructions suitable for execution by a general purpose processor or application specific processor. The embodiments, however, are not limited in this context.

The functions of the various functional elements, logical blocks, modules, and circuits elements described in connection with the embodiments disclosed herein may be implemented in the general context of computer executable instructions, such as software, control modules, logic, and/or logic modules executed by the processing unit. Generally, software, control modules, logic, and/or logic modules comprise any software element arranged to perform particular operations. Software, control modules, logic, and/or logic modules can comprise routines, programs, objects, components, data structures and the like that perform particular tasks or implement particular abstract data types. An implementation of the software, control modules, logic, and/or logic modules and techniques may be stored on and/or transmitted across some form of computer-readable media. In this regard, computer-readable media can be any available medium or media useable to store information and accessible by a computing device. Some embodiments also may be practiced in distributed computing environments where operations are performed by one or more remote processing devices that are linked through a communications network. In a distributed computing environment, software, control modules, logic, and/or logic modules may be located in both local and remote computer storage media including memory storage devices.

Additionally, it is to be appreciated that the embodiments described herein illustrate example implementations, and that the functional elements, logical blocks, modules, and circuits elements may be implemented in various other ways which are consistent with the described embodiments. Furthermore, the operations performed by such functional elements, logical blocks, modules, and circuits elements may be combined and/or separated for a given implementation and may be performed by a greater number or fewer number of components or modules. As will be apparent to those of skill in the art upon reading the present disclosure, each of the individual embodiments described and illustrated herein has discrete components and features which may be readily separated from or combined with the features of any of the other several aspects without departing from the scope of the present disclosure. Any recited method can be carried out in the order of events recited or in any other order which is logically possible.

Unless specifically stated otherwise as apparent from the foregoing discussion, it is appreciated that, throughout the foregoing description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some aspects may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other, but yet still co-operate or interact with each other.

It is worthy to note that any reference to "one aspect," "an aspect," "one embodiment," or "an embodiment" means that a particular feature, structure, or characteristic described in connection with the aspect is included in at least one aspect. Thus, appearances of the phrases "in one aspect," "in an aspect," "in one embodiment," or "in an embodiment" in various places throughout the specification are not necessarily all referring to the same aspect. Furthermore, the particular features, structures or characteristics may be combined in any suitable manner in one or more aspects.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed embodiments. The following claims are intended to cover all such modification and variations.

Some or all of the embodiments described herein may generally comprise technologies for manufacturing semiconductor integrated circuits, or otherwise according to technologies described herein. In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

All of the above-mentioned U.S. patents, U.S. patent application publications, U.S. patent applications, foreign patents, foreign patent applications, non-patent publications referred to in this specification and/or listed in any Application Data Sheet, or any other disclosure material are incorporated herein by reference, to the extent not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory).

A sale of a system or method may likewise occur in a territory even if components of the system or method are located and/or used outside the territory. Further, implementation of at least part of a system for performing a method in one territory does not preclude use of the system in another territory.

Although various embodiments have been described herein, many modifications, variations, substitutions, changes, and equivalents to those embodiments may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed embodiments. The following claims are intended to cover all such modification and variations.

In summary, numerous benefits have been described which result from employing the concepts described herein. The foregoing description of the one or more embodiments has been presented for purposes of illustration and description. It is not intended to be exhaustive or limiting to the precise form disclosed. Modifications or variations are possible in light of the above teachings. The one or more embodiments were chosen and described in order to illustrate principles and practical application to thereby enable one of ordinary skill in the art to utilize the various embodiments and with various modifications as are suited to the particular use contemplated. It is intended that the claims submitted herewith define the overall scope.

The invention claimed is:

1. A computer-implemented method of creating a logic integrated circuit cell from an original logic integrated circuit cell, the method comprising:
  combining, by a processor, the original logic integrated circuit cell with a second integrated circuit cell, wherein the inputs of the second integrated circuit cell are the complement of each of the inputs of the original logic integrated circuit cell and the output of the second integrated circuit cell is the complement of the output of the original logic integrated circuit cell;
  connecting, by the processor, the combined logic integrated circuit cell, to one or more other combined logic integrated circuit cell, such that the output of the original logic integrated circuit cell from the combined logic integrated circuit cell is connected to the inputs of the one or more other combined logic integrated circuit cells, and the output of the second integrated circuit cell from the combined integrated circuit cell is connected to the inputs of the one or more other combined logic integrated circuit cells as the complement of the output from the original logic integrated circuit cell; and
  simplifying, by the processor, the combined logic integrated circuit cell, wherein simplifying the combined logic integrated circuit cell comprises:

disconnecting, by the processor, each circuit node in the combined logic integrated circuit cell, which has a voltage value equal to the complement of one of the inputs to the original logic integrated circuit cell, from the circuit portion that provides the input to each of these circuit nodes; and connecting, by the processor, the disconnected circuit nodes to an external signal with this voltage value.

2. The method according to claim 1, wherein disconnecting each circuit node in the combined logic integrated circuit cell comprises disconnecting, by the processor, each circuit node in the combined logic integrated circuit cell, which has a voltage value that is equal to the complement of one of the inputs to the original logic integrated circuit cell in all states of the circuit.

3. The method according to claim 1, wherein simplifying the combined logic integrated circuit cell comprises:
    disconnecting, by the processor, each circuit node in the combined logic integrated circuit cell, which has a voltage value equal to one of the inputs to the original logic integrated circuit cell, from the circuit portion that provides the input to the circuit node; and
    connecting, by the processor, the disconnected circuit nodes to an external signal with this voltage value.

4. The method according to claim 3, wherein disconnecting each circuit node in the combined logic integrated circuit cell comprises disconnecting each circuit node in the combined logic integrated circuit cell, which has a voltage value equal to one of the inputs to the original logic integrated circuit cell in all states of the circuit.

5. The method according to claim 3, wherein simplifying the combined logic integrated circuit cell comprises:
    analyzing, by the processor, the such re-connected combined logic integrated circuit cell by applying an error signal to each of the inputs, one at a time, for each valid input combination; and
    recording, by the processor, the impact on all output nodes of the combined logic integrated circuit cell.

6. The method according to claim 5, wherein simplifying the combined logic integrated circuit cell comprises reversing, by the processor, the connection and disconnection for each circuit node for which an error signal applied to this circuit node gave an error signal on both an original output and its complement output.

7. The method according to claim 6, wherein simplifying the combined logic integrated circuit cell comprises removing, by the processor, circuit portions that are fully disconnected from the circuit that generates the output signals of the combined logic integrated circuit cell.

8. A semiconductor integrated circuit, implemented by a computer-implemented method of creating a logic integrated circuit cell from an original logic integrated circuit cell, the method comprising:
    combining, by a processor, the original logic integrated circuit cell with a second integrated circuit cell, wherein the inputs of the second integrated circuit cell are the complement of each of the inputs of the original logic integrated circuit cell and the output of the second integrated circuit cell is the complement of the output of the original logic integrated circuit cell;
    connecting, by the processor, the combined logic integrated circuit cell, to one or more other combined logic integrated circuit cell, such that the output of the original logic integrated circuit cell from the combined logic integrated circuit cell is connected to the inputs of the one or more other combined logic integrated circuit cells, and the output of the second integrated circuit cell from the combined integrated circuit cell is connected to the inputs of the one or more other combined logic integrated circuit cells as the complement of the output from the original logic integrated circuit cell,
    wherein the semiconductor integrated circuit, comprises:
    a physical arrangement where contact areas of one or more devices have been placed along a line in a substrate, and where n-type contact areas of the combined logic integrated circuit cell, which are connected to an output (q) of the original logic integrated circuit cell (n-q), and connected to an output (qi) of the second integrated circuit cell (n-qi), and p-type contact areas of the combined logic integrated circuit cell, which are connected to q (p-q) and to qi (p-qi), are ordered along the line in the substrate such that in-between an n-q node and a p-qi node there is always at least one n-qi node and/or at least one p-q node, and such that in-between an n-qi node and a p-q node there is always at least one n-q node and/or at least one p-qi node;
    wherein the logic integrated circuit cell implements an exclusive OR (XOR) logic function using complementary metal-oxide-semiconductor (CMOS) technology, the logic circuit cell comprising:
    eight n-type MOS field-effect-transistors (FET) (MOSFET) devices and eight p-type MOSFET devices;
    four input signals a, b, ai, bi, wherein ai is the inverse complement of a, and bi is the inverse complement of b;
    a power node (VDD), which is connected to a high voltage for the logic circuit cell and a ground node (GND), which is connected to a low voltage for the logic circuit cell; and
    two output nodes, q and qi, wherein qi is the inverse complement of q.

9. The semiconductor integrated circuit of claim 8, wherein the logic circuit cell comprises a connection of devices such that the output node q provides an XOR function of the two inputs a and b, and the output node qi provides a complement of the XOR function (NXOR) on the two inputs ai and bi.

10. The semiconductor integrated circuit of claim 8, wherein the logic circuit cell, comprises:
    six internal circuit nodes p1, n1a, n1b, p2a, p2b, n2, connected between the MOSFET devices;
    a connection between the eight p-type MOSFET devices, where source, gate, and drain nodes are connected as follows: (vdd, a, p1), (vdd, b, p1), (p1, ai, q), (p1, bi, q), (vdd, ai, p2a), (vdd, a, p2b), (p2a, bi, qi), (p2b, b, qi); and
    a connection between the eight n-type MOSFET devices, where source, gate, and drain nodes are connected as follows: (gnd, b, n1a), (gnd, bi, n1b), (n1a, a, q), (n1b, ai, q), (gnd, a, n2), (gnd, b, n2), (n2, ai, qi), (n2, bi, qi).

11. The semiconductor integrated circuit of claim 10, wherein the logic circuit cell, comprises another connection between the p-type and n-type MOSFET devices which gives the XOR function on the inputs a and b on node q and the complement of the XOR function on the inputs ai and bi on the node qi.

12. The semiconductor integrated circuit of claim 11, wherein the logic circuit cell, a physical layout arrangement where contact areas of the n-type and the p-type MOSFET devices have been placed along a line in a substrate, and where n-type contact areas, which are connected to an output (q) of an original circuit (n-q), and connected to an output (qi) of a second circuit (n-qi), and p-type contact areas which are connected to q (p-q) and to qi (p-qi) are ordered along the line in the substrate such that in-between an n-q node and a p-qi node, there is always at least one n-qi node and/or at least one p-q node, and that in-between an n-qi node and a p-q node there is always at least one n-q node and/or at least one p-qi node.

13. The semiconductor integrated circuit of claim 11, wherein the logic circuit cell, comprises a physical layout arrangement where the contact areas are ordered along a line in the layout with the following order:

[gnd, n1*a*, n-q, n1*b*, gnd, n2, n-qi, n2, gnd, vdd, p2*b*, p-qi, p2*a*, vdd, p1, p-q, p1, vdd].

* * * * *